(12) United States Patent
Tsukamoto et al.

(10) Patent No.: US 10,991,781 B2
(45) Date of Patent: Apr. 27, 2021

(54) DISPLAY DEVICE CONFIGURED TO SWITCH BETWEEN SINGLE-SIDED AND DOUBLE-SIDED DISPLAY

(71) Applicant: Sharp Kabushiki Kaisha, Sakai (JP)

(72) Inventors: Yuto Tsukamoto, Sakai (JP); Shinichi Kawato, Sakai (JP); Manabu Niboshi, Sakai (JP); Hiroshi Imada, Sakai (JP); Tokiyoshi Umeda, Sakai (JP); Bai Zhang, Sakai (JP); Tomoaki Jo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 401 days.

(21) Appl. No.: 16/073,815

(22) PCT Filed: May 29, 2017

(86) PCT No.: PCT/JP2017/019942
§ 371 (c)(1),
(2) Date: Jul. 30, 2018

(87) PCT Pub. No.: WO2018/220684
PCT Pub. Date: Dec. 6, 2018

(65) Prior Publication Data
US 2020/0411621 A1 Dec. 31, 2020

(51) Int. Cl.
*H01L 27/32* (2006.01)
*H01L 51/52* (2006.01)

(52) U.S. Cl.
CPC ...... *H01L 27/3262* (2013.01); *H01L 27/3232* (2013.01); *H01L 51/524* (2013.01);
(Continued)

(58) Field of Classification Search
CPC ............. H01L 27/3262; H01L 27/3232; H01L 51/524; H01L 51/5253; H01L 51/5271;
(Continued)

(56) References Cited

U.S. PATENT DOCUMENTS

2012/0140304 A1* 6/2012 Kuhlman ............. G02F 1/1347
359/228
2012/0241796 A1 9/2012 Naito
(Continued)

FOREIGN PATENT DOCUMENTS

| CN | 105789241 A | 7/2016 |
| CN | 205542787 U | 8/2016 |

(Continued)

OTHER PUBLICATIONS

Official Communication issued in International Patent Application No. PCT/JP2017/019942, dated Jul. 18, 2017.

*Primary Examiner* — Matthew E. Gordon
(74) *Attorney, Agent, or Firm* — Keating & Bennett, LLP

(57) ABSTRACT

An organic EL display device includes a light modulating unit layer, a TFT layer, and a plurality of organic EL elements layered in the stated order. A top-emitting single-sided display emitting light emitted from a light emitting layer from an upper electrode side and a double-sided display emitting light emitted from the light emitting layer from each of the upper electrode side and a lower electrode side are electrically switched.

14 Claims, 13 Drawing Sheets

(52) U.S. Cl.
CPC ...... *H01L 51/5253* (2013.01); *H01L 51/5271* (2013.01); *H01L 2251/5315* (2013.01); *H01L 2251/5323* (2013.01); *H01L 2251/5338* (2013.01)

(58) Field of Classification Search
CPC ..... H01L 2251/5315; H01L 2251/5323; H01L 2251/5338
See application file for complete search history.

(56) References Cited

U.S. PATENT DOCUMENTS

2012/0327498 A1\* 12/2012 Arai ............... H01L 27/3232
359/267
2015/0255519 A1\* 9/2015 Lee ............... H01L 51/5271
345/207
2016/0307972 A1\* 10/2016 Diekmann ............ G02F 1/137

FOREIGN PATENT DOCUMENTS

| DE | 10 2012 205 413 A1 | 10/2013 |
|---|---|---|
| JP | 2002-334792 A | 11/2002 |
| JP | 2009-099400 A | 5/2009 |
| JP | 2012-204184 A | 10/2012 |
| JP | 2014-017077 A | 1/2014 |
| JP | 2016-170887 A | 9/2016 |
| KR | 10-2014-0062258 A | 5/2014 |

\* cited by examiner

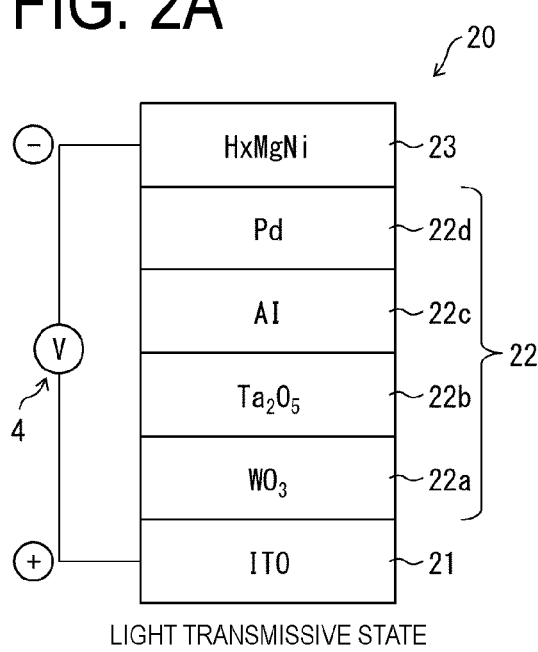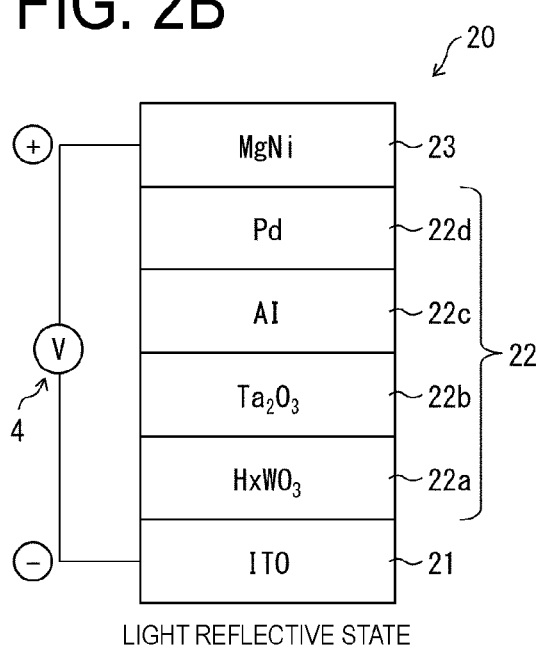

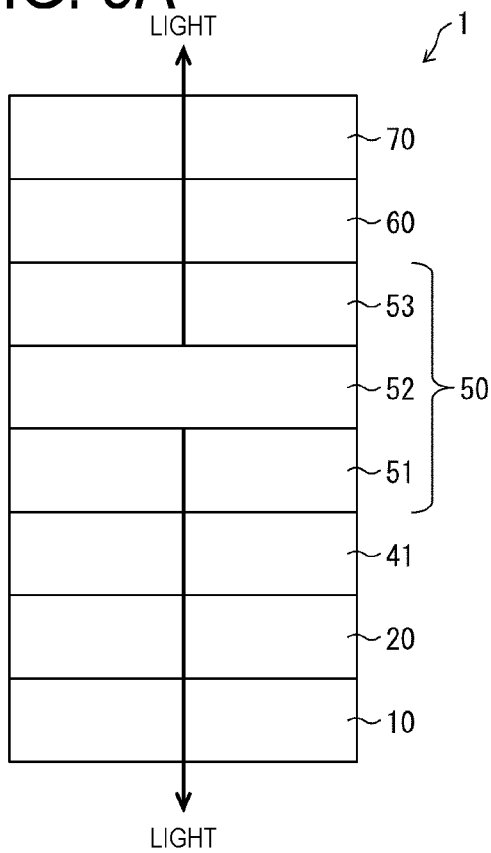
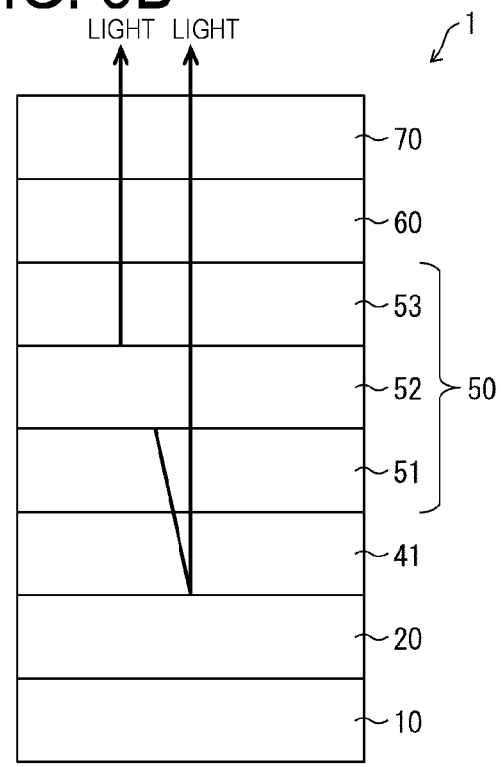

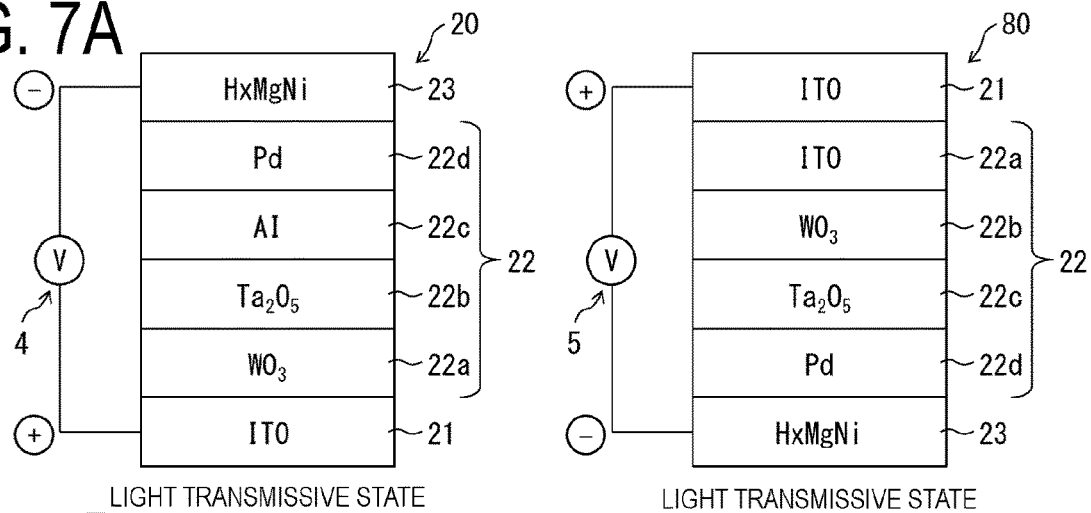
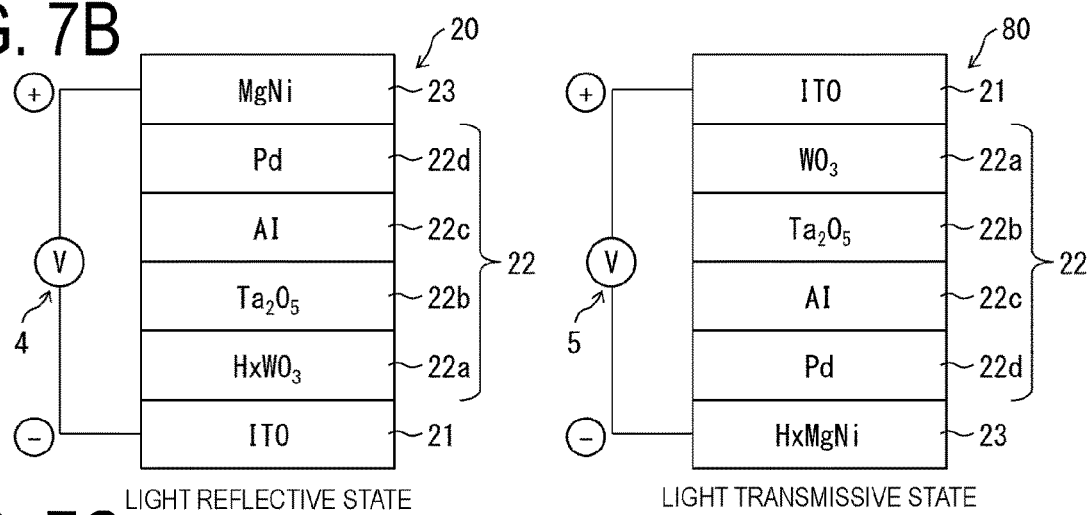
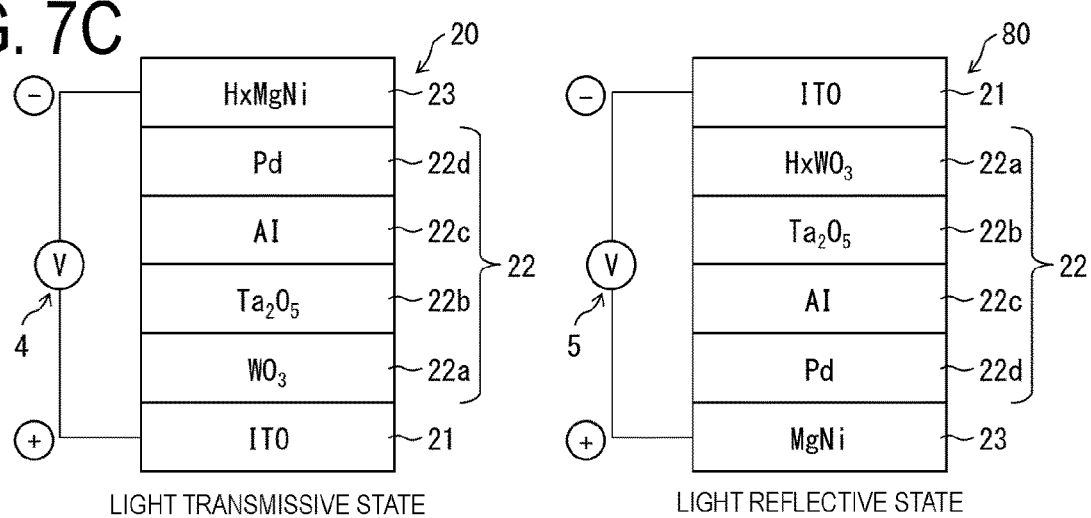

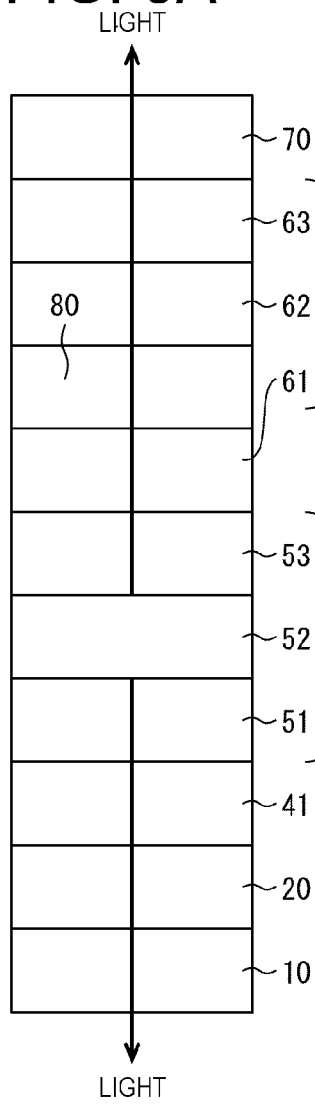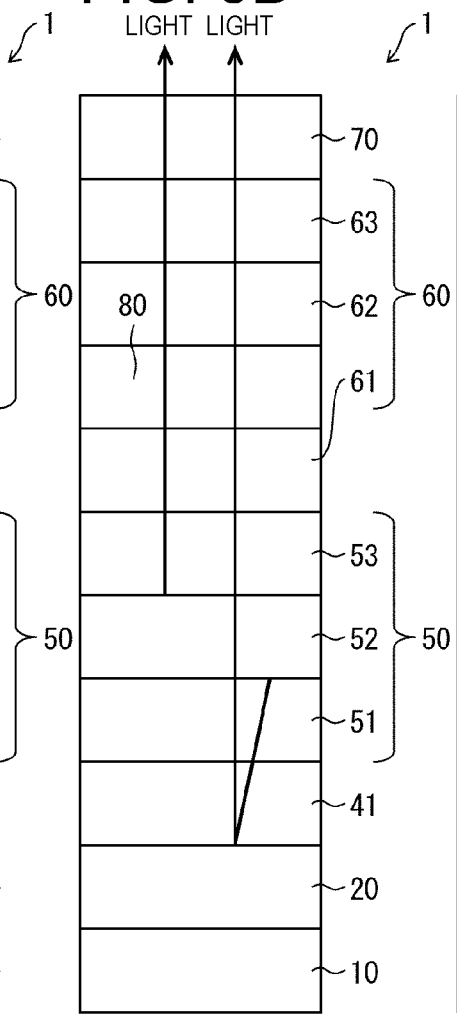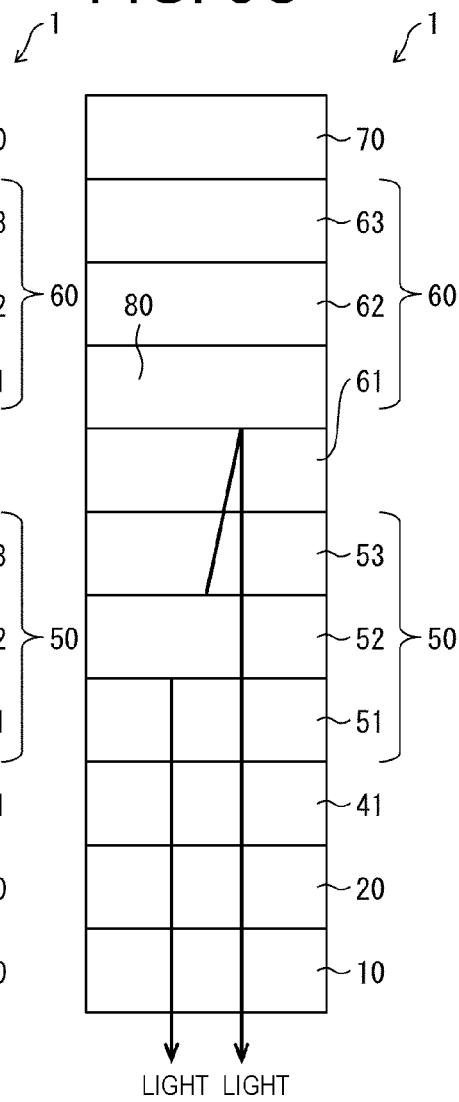

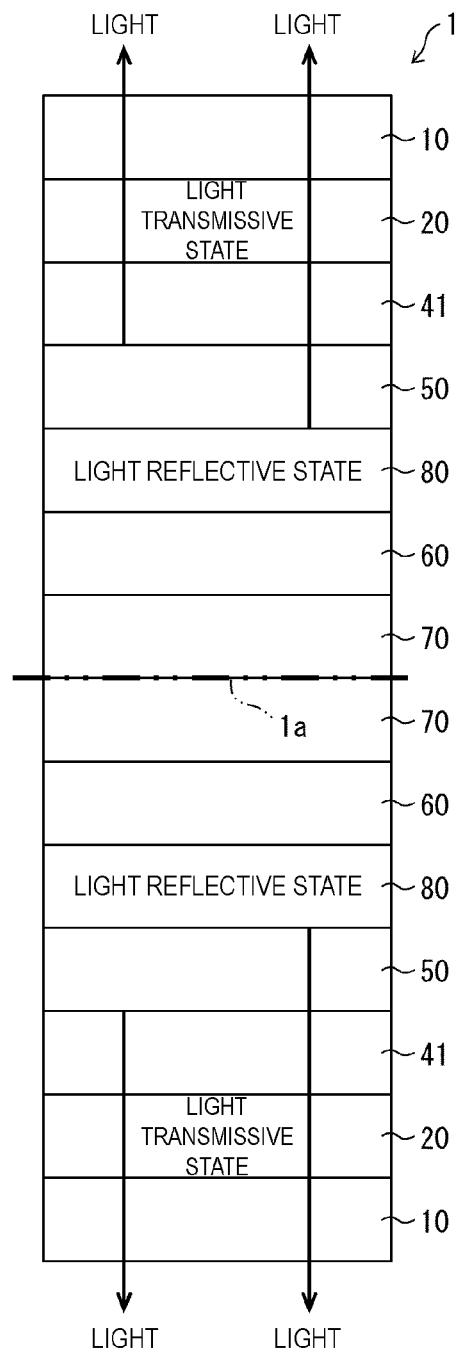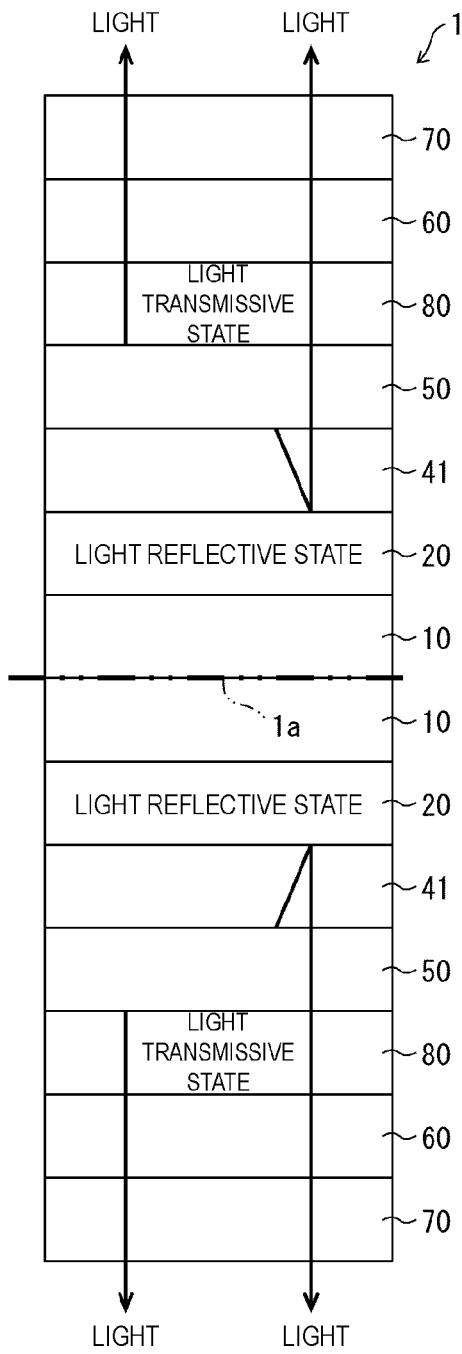

DISPLAY DEVICE CONFIGURED TO SWITCH BETWEEN SINGLE-SIDED AND DOUBLE-SIDED DISPLAY

TECHNICAL FIELD

The disclosure relates to a display device that performs display including switching between a single-sided display performing a light reflective display and a double-sided display performing a light transmissive display.

BACKGROUND ART

In recent years, see-through displays and transparent displays, which are so-called transparent display devices, have been attracting attention in terms of improved interior design and interactivity.

TA transparent display device allows an object behind the transparent display device to be observed through screen. By disposing the transparent display device in front of various displays such as an instrumental panel of automobiles, for example, the transparent display device enables display including switching between display by the transparent display device and display on the back of the transparent display device. Thus, application to various uses is expected.

As the transparent display device, for example, an organic EL display device that includes organic EL elements using electro luminescence (hereinafter referred to as "EL") of an organic luminescent material is well known (for example, see PTL 1 or the like).

A display unit of the organic EL display device includes organic EL elements in which a light emitting layer including an organic matter as an emitter is layered so as to be sandwiched between a negative electrode and a positive electrode, and includes the organic EL elements arranged two-dimensionally as pixels. For example, a transparent organic EL display device is achieved by using a transparent electrode as a negative electrode and a positive electrode.

CITATION LIST

Patent Literature

PTL 1: JP 2002-334792 A (published on Nov. 22, 2002).

SUMMARY

Technical Problem

However, such a display device including a transparent electrode as both a positive electrode and a negative electrode cannot be used when information on the back is not desired to be disclosed because light emitted from a light emitting layer is radiated to both front and back surfaces of the display device.

Furthermore, light is weak in a double-sided display, which is darker than single-sided light emission.

The disclosure has been made in view of the above-mentioned problems, and an object thereof is to provide a display device capable of switching between a single-sided display and a double-sided display.

Solution to Problem

To solve the above-mentioned problems, a display device according to the disclosure is a display device that includes a plurality of pixels each including a light emitting element including at least a light emitting layer between a lower electrode and an upper electrode and a drive element electrically connected to the light emitting element. The display device includes a first light modulating unit layer that includes a first light modulating layer configured to electrically switch between a light transmissive state and a light reflective state. The first light modulating unit layer, a drive element layer including a plurality of the drive elements, and a plurality of the light emitting elements are layered in the stated order. A top-emitting single-sided display emitting light emitted from the light emitting layer from the upper electrode side and a double-sided display emitting light emitted from the light emitting layer from each of the upper electrode side and the lower electrode side are electrically switched between.

Advantageous Effects of Disclosure

According to the disclosure, a display device capable of switching between a top-emitting single-sided display emitting light emitted from the light emitting layer from the upper electrode side being a front side and a double-sided display emitting light emitted from the light emitting layer from each of the upper electrode side and the lower electrode side can be provided. This enables the double-sided display and also enables display of information only on the front side when disclosure of information on the back side is not desired. The display device offering selection of the double-sided display and the single-sided display, which is brighter than the double-sided display, can be provided.

BRIEF DESCRIPTION OF DRAWINGS

FIG. 2A is a diagram schematically illustrating a layered structure of a light modulating unit layer in a transparent state in the organic EL display device according to the first embodiment of the disclosure. FIG. 2B is a diagram schematically illustrating a layered structure of the light modulating unit layer mentioned above in a mirror state.

FIG. 3A is a diagram schematically illustrating a situation where a double-sided display is performed in the organic EL display device according to the first embodiment of the disclosure. FIG. 3B is a diagram schematically illustrating a situation where a top-emitting display is performed in the organic EL display device mentioned above.

FIGS. 7A to 7C are diagrams schematically illustrating a layered structure of each light modulating unit layer in the organic EL display device according to the second embodiment of the disclosure.

FIG. 8A is a diagram schematically illustrating a situation where a double-sided display is performed in the organic EL display device according to the second embodiment of the disclosure. FIG. 8B is a diagram schematically illustrating a situation where a top-emitting display is performed in the organic EL display device mentioned above. FIG. 8C is a diagram schematically illustrating a situation where a bottom-emitting display is performed in the organic EL display device mentioned above.

FIGS. 13A and 13B are diagrams each schematically illustrating an example of a display manner of the organic EL display device according to the fourth embodiment of the disclosure.

DESCRIPTION OF EMBODIMENTS

First Embodiment

A description follows regarding an embodiment of the disclosure, with reference to FIGS. 1 to 5.

Hereinafter, an organic EL display device including an Organic Light Emitting Diode (OLED) element called an organic EL element as a light emitting element will be described as an example of a display device according to the present embodiment.

Note that dimensions, materials, shapes, or the like of respective components described in the present embodiment merely pertain to one embodiment, and interpretation of the scope of the disclosure should not be limited thereto.

Schematic Configuration of Organic EL Display Device

Figure 1:
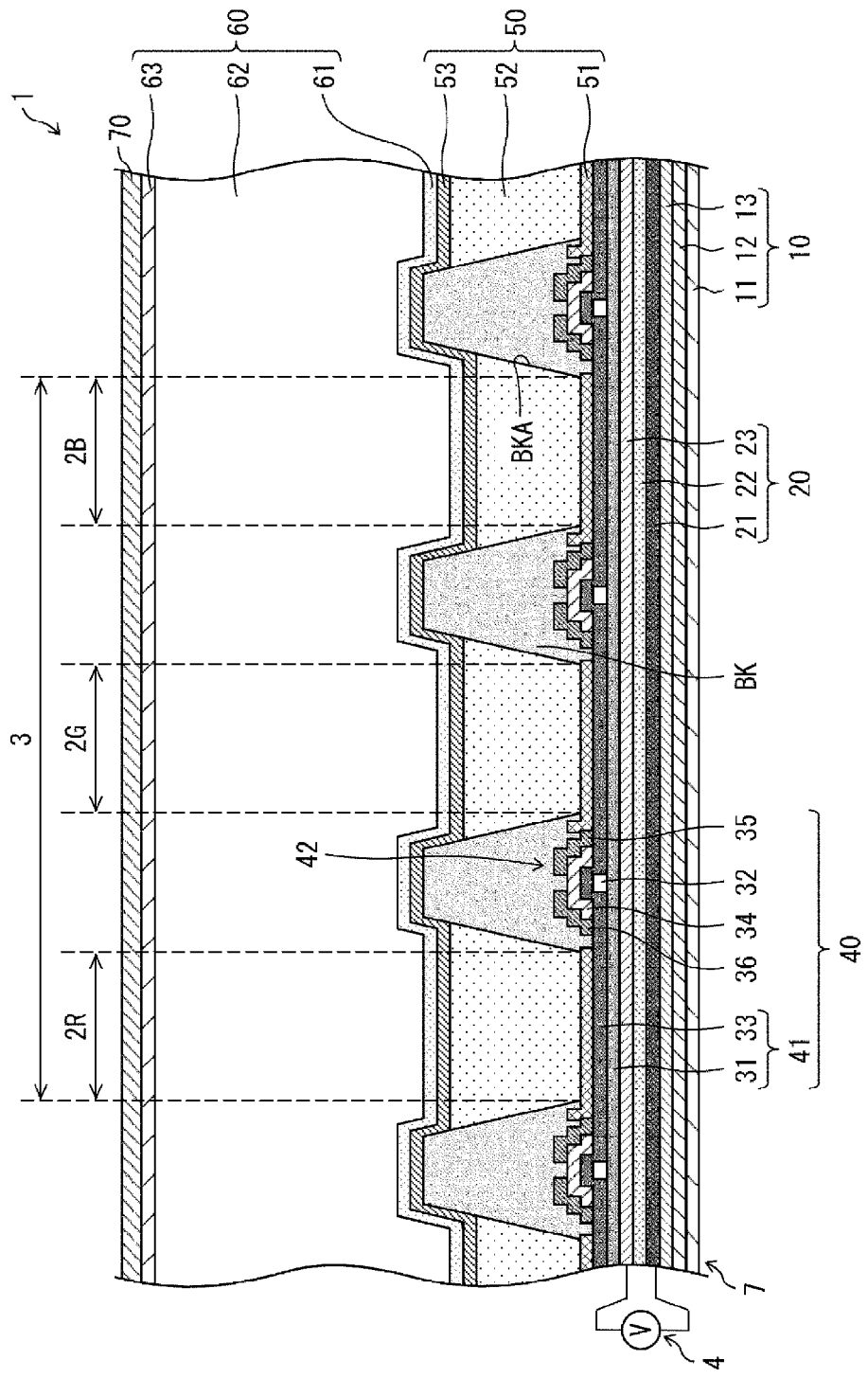
FIG. 1 is a cross-sectional view illustrating an example of a schematic configuration of a main portion of an organic EL display device according to a first embodiment of the disclosure.

FIG. 1 is a cross-sectional view illustrating an example of a schematic configuration of a main portion of an organic EL display device 1 according to the present embodiment. FIG. 2A is a diagram schematically illustrating a layered structure of a light modulating unit layer 20 in a transparent state. FIG. 2B is a diagram schematically illustrating a layered structure of the light modulating unit layer 20 in a mirror state.

As illustrated in FIG. 1, the organic EL display device 1 according to the present embodiment includes a pixel part formed of an organic EL display panel 7 and a circuit part including a switch unit 4 (first switch unit).

The organic EL display device 1 may be a flexible display device being bendable and having flexibility, and may be, for example, a folding flexible display device (foldable display) capable of being folded (bent and unfolded (extended) by opening and closing actions. However, the organic EL display device 1 is not limited to the flexible display device and may be a display device having rigidity and being unbendable.

Organic EL Display Panel 7

The organic EL display panel 7 is an active matrix display panel. The organic EL display panel 7 has a configuration in which the light modulating unit layer 20 (first light modulating unit layer), a Thin Film Transistor (TFT) layer 40, an organic EL element 50 and a bank BK, a sealing film 60, and a cover layer 70 are provided on a support body 10 in the stated order from the support body 10 side. Note that the support body 10 side and the cover layer 70 side will be described below as a lower side and an upper side, respectively.

In the present embodiment, for example, a see-through double-sided display is performed during a light transmissive display (that is to say, in a case in which the light modulating unit layer 20 is in a light transmissive state). Thus, a layer that is transparent or semitransparent during the light transmissive display is preferably used for each of the above-mentioned layers in the organic EL display panel 7. In other words, it is preferable that layers other than the light modulating unit layer 20 (more specifically, layers other than a light modulating mirror layer 23 as a light modulating layer having light transmittance changed by applied voltage in the light modulating unit layer 20) in the organic EL display panel 7 mentioned above are formed of a transparent or semitransparent layer.

Support Body 10

A transparent or semitransparent support body having transparency is used for the support body 10. Examples of the support body 10 include, for example, a glass substrate, a plastic substrate, and a plastic film. As illustrated in FIG. 1, the support body 10 may be a layered film having flexibility in which a barrier layer 13 (moisture-proof layer, inorganic insulating layer) is provided on a resin layer 12 (plastic film). A flexible display device such as a foldable display can be obtained by using such a layered film for the support body 10. When such a layered film is used for the support body 10, the above-mentioned layered film may have a configuration in which a lower face film 11 facing the outside is further provided on a surface of the resin layer 12 opposite to the barrier layer 13 interposed by an adhesive layer, which is not illustrated.

For example, a resin such as polyimide, polyethylene, and polyamide is used for the resin layer 12.

The barrier layer 13 is a layer that prevents moisture and impurities from reaching the TFT layer 40 and the organic EL element 50 formed on the support body 10 and can be formed of, for example, a silicon oxide ($SiO_x$) film, a silicon nitride ($SiN_x$) film, or a layered film of the silicon oxide film and the silicon nitride film. The barrier layer 13 is provided across the entire surface of the resin layer 12 such that the surface of the resin layer 12 is not exposed.

The lower face film 11 is used for manufacturing a flexible display device having sufficient strength even with an extremely thin resin layer 12. For example, a plastic film made of resin having flexibility such as polyethylene terephthalate, polyethylene naphthalate, cycloolefin polymer, polyimide, polycarbonate, polyethylene, and aramid is used for the lower face film 11.

Light Modulating Unit Layer 20

The light modulating unit layer 20 is a light modulating unit (light modulating element) in which a light reflective state (light reflective mode, mirror state) reflecting light and a light transmissive state (light transmissive mode, for example, transparent state) allowing light to be transmitted are electrically switched therebetween by voltage applied to the light modulating unit layer 20.

As illustrated in FIG. 1, the light modulating unit layer 20 has a configuration in which a light transmissive electrode layer 21 (first electrode layer), an intermediate layer 22, and a light modulating mirror layer 23 (first light modulating layer) are layered in the stated order from the support body 10 side.

The light modulating mirror layer 23 is a light modulating layer that functions as an electrode (second electrode layer) and in which a light reflective state (mirror state) reflecting light and a light transmissive state (for example, transparent state) allowing light to be transmitted are switched therebetween by applied voltage.

As illustrated in FIGS. 2A and 2B, the intermediate layer 22 has a configuration in which, for example, an ion storage layer 22a, a solid electrolytic layer 22b, a buffer layer 22c, and a catalytic layer 22d are layered in the stated order from the light transmissive electrode layer 21 side or a configuration in which, for example, the ion storage layer 22a, the solid electrolytic layer 22b, and the catalytic layer 22d are layered in the stated order from the light transmissive electrode layer 21 side.

The ion storage layer 22a stores hydrogen ions. The buffer layer 22c prevents a catalyst from being diffused into the solid electrolytic layer 22b due to repetitive switching of voltage. The catalytic layer 22d promotes access for hydrogen to the light modulating mirror layer 23.

A transparent electrode or a semitransparent electrode is used as the light transmissive electrode layer 21. Examples of the transparent electrode include, for example, ITO, IZO, $SnO_2$, and ZnO. Examples of the semitransparent electrode include, for example, a thin film of a metal, such as Al, Ag, Au, Mg, Ca, Li, and Cr, or a thin film of an alloy containing such metals. A tungsten oxide ($H_xWO_3$) thin film, for example, is used as the ion storage layer 22a. A tantalum oxide ($Ta_2O_5$) thin film, for example, is used as the solid electrolytic layer 22b. An aluminum (Al) thin film, for example, is used as the buffer layer 22c. A palladium (Pd) thin film, for example, is used as the catalytic layer 22d. Examples of the light modulating mirror layer 23 include, for example, a magnesium alloy thin film such as a magnesium-nickel (Mg—Ni) alloy thin film, a magnesium-titanium (Mg—Ti) alloy thin film, a magnesium-calcium (Mg—Ca) alloy thin film, a magnesium-cobalt (Mg—Co) alloy thin film, a magnesium-niobium (Mg—Nb) alloy thin film, a magnesium-barium (Mg—Ba) alloy thin film, and a magnesium-strontium (Mg—Sr) alloy thin film. Each of these layers can be film-formed by magnetron sputtering.

FIGS. 2A and 2B exemplify, as an example, a case in which the intermediate layer 22 includes the ion storage layer 22a, the solid electrolytic layer 22b, the buffer layer 22c, and the catalytic layer 22d layered in the stated order from the light transmissive electrode layer 21 side while the light transmissive electrode layer 21, the ion storage layer 22a, the solid electrolytic layer 22b, the buffer layer 22c, the catalytic layer 22d, and the light modulating mirror layer 23 are respectively ITO, $WO_3$, $Ta_2O_5$, Al, Pd, and a Mg—Ni alloy.

DC voltage is used as voltage applied to the light modulating unit layer 20. The light modulating unit layer 20 can switch between states of the light modulating mirror layer 23 (that is to say, modulate light) by reversing the polarity of the voltage applied to the light modulating unit layer 20 as illustrated in FIGS. 2A and 2B, for example.

TFT Layer 40

The TFT layer 40 includes a TFT 42 as a drive transistor (drive element) configured to drive the organic EL element 50 described below, a TFT (not illustrated) as a switching transistor (switching element), wiring (not illustrated), and a terminal portion (not illustrated) that includes a plurality of terminals for external connection, on an inorganic insulating layer 31 in solid form.

The TFT 42 has a layered structure in which, for example, a gate electrode 32, an inorganic insulating layer 33 as a gate insulating film, a semiconductor layer 34, a source electrode 35, and a drain electrode 36 are layered in the stated order. Note that a channel protection layer, which is not illustrated, may be provided between the semiconductor layer 34, the source electrode 35, and the drain electrode 36. The TFT as the switching transistor has the same layered structure as that of the TFT 42.

The inorganic insulating layer 31 and the inorganic insulating layer 33 are each formed in a solid form. Thus, as illustrated in FIG. 1, the inorganic insulating layer 31 and the inorganic insulating layer 33 are layered to be adjacent to each other in an opening BKA (namely, each light emitting region) of the bank BK. Accordingly, a layered film formed of the inorganic insulating layer 31 and the inorganic insulating layer 33 is referred to as an inorganic insulating film 41 hereinafter.

The inorganic insulating layer 31 is provided in solid form on the light modulating unit layer 20 so as to cover the light modulating unit layer 20.

A patterned gate layer is provided on the inorganic insulating layer 31. The gate layer includes a plurality of gate electrodes including the gate electrode 32 of the TFT 42, a plurality of gate wires, which are not illustrated, and a plurality of low level power source lines, which are not illustrated.

A gate electrode of the switching transistor is connected to the gate wires. The gate electrode 32 of the TFT 42 as the drive transistor is connected to, for example, a drain electrode of the switching transistor described below. The low level power source line is provided in parallel with the gate wires between the adjacent gate wires.

The inorganic insulating layer 33 is provided in solid form on the inorganic insulating layer 31 so as to cover the above-mentioned gate layer.

A plurality of semiconductor layers having an island-shape and including the semiconductor layer 34 of the TFT 42, a patterned source layer, and a plurality of lower electrodes 51 described below are provided on the inorganic insulating layer 33. The source layer includes the plurality of semiconductor layers having an island shape and including the semiconductor layer 34 of the TFT 42, a plurality of source electrodes including the source electrode 35 of the TFT 42, a plurality of drain electrodes including the drain electrode 36 of the TFT 42, a plurality of source wires, which are not illustrated, and a plurality of high level power source lines, which are not illustrated.

The semiconductor layer 34 is superposed on the gate electrode 32 with the inorganic insulating layer 33 therebetween. Each of the source electrode 35 and the drain electrode 36 is electrically connected to the semiconductor layer 34. At least part of each of the source electrode 35 and the drain electrode 36 is superposed on a part of the semiconductor layer 34.

Similarly, a semiconductor layer of the switching transistor is superposed on the gate electrode of the switching transistor with the inorganic insulating layer 33 therebetween. Each of a source electrode and the drain electrode of the switching transistor is electrically connected to the semiconductor layer of the switching transistor.

As illustrated in FIG. 1, the source electrode 35 of the TFT 42 is connected to, for example, the lower electrode 51 of the organic EL element 50 described below. The drain electrode 36 of the TFT 42 is connected to, for example, the high level power source lines. The source electrode of the switching transistor is connected to source wires, which are not illustrated. As described above, the drain electrode of the switching transistor is connected to the gate electrode 32 of the TFT 42.

The gate wires and the source wires are provided to be orthogonal to each other in a plan view. The high level power source line is provided in parallel with the source wires between the adjacent source wires.

A region partitioned by the gate wires and the source wires (for example, a region partitioned into matrix) is one pixel. For example, a set of a red (R) pixel 2R, a green (G) pixel 2G, and a blue (B) pixel 2B forms one pixel 3. Hereinafter, these pixels 2R, 2G, and 2B are collectively referred to as a pixel 2. Each of the pixel 2 includes the TFT 42 and the switching transistor.

FIG. 1 illustrates that one end portion of the lower electrode 51 is connected to the top of one end portion of the source electrode 35 as an example, but one end portion of the source electrode 35 may be connected to the top of one end portion of the lower electrode 51.

The TFT layer 40 is preferably transparent or semitransparent (that is to say, has transparency), and is preferably formed of a transparent or semitransparent inorganic insulating film, a transparent or semitransparent conductive film, and a transparent or semitransparent semiconductor layer.

Specifically, the inorganic insulating layers 31, 33 are formed of, for example, a silicon oxide ($SiO_x$) film, a silicon nitride ($SiN_x$) film, or a layered film of the silicon oxide film and the silicon nitride film. The semiconductor layer 34 is formed of, for example, an oxide semiconductor film such as $InGaZnO_x$.

Examples of the gate layer and the source layer (namely, the gate electrode 32, the source electrode 35, the drain electrode 36, and the wiring group connected to these) include a thin film of a metal such as aluminum (Al), silver (Ag), gold (Au), magnesium (Mg), calcium (Ca), lithium (Li), and chromium (Cr) or of an alloy of the metals (namely, a metal semitransparent electrode), an oxide semiconductor film such as $InGaZnO_x$, and a transparent conductive film such as indium tin oxide (ITO), indium zinc oxide (IZO), tin oxide ($SnO_2$), and zinc oxide (ZnO).

Organic EL Element 50

The organic EL element 50 is a light emitting element capable of emitting light at high luminance using low voltage direct current driving, and has a configuration in which the lower electrode 51 (positive electrode), an organic EL layer 52, and an upper electrode 53 (negative electrode) are layered in the stated order, as illustrated in FIG. 1.

The lower electrode 51 injects (supplies) holes into the organic EL layer 52. The upper electrode 53 injects (supplies) electrons into the organic EL layer 52. In the present embodiment, layers between the lower electrode 51 and the upper electrode 53 are collectively referred to as the organic EL layer 52.

The lower electrode 51 is a pattern electrode patterned in an island shape for every pixel 2. On the other hand, the upper electrode 53 is a common electrode in solid form common to the pixels 2.

As described above, in the present embodiment, the lower electrode 51 is directly provided to be adjacent to the source electrode 35 of the TFT 42 on the inorganic insulating layer 33 as the gate insulating film without an interlayer insulating film formed of an organic insulating film located between the lower electrode 51 and the inorganic insulating layer 33. Thus, the lower electrode 51 is directly connected to the source electrode 35 without the above-mentioned interlayer insulating film therebetween.

As illustrated in FIG. 1, each end portion of the lower electrode 51 is covered with the bank BK. Thus, the TFT 42 is covered with the bank BK.

The bank BK functions as an edge cover to prevent shorting between the lower electrode 51 and the upper electrode 53 in the organic EL element 50 due to thinning of the organic EL layer 52 or to a concentration of electric field arising at pattern end portions of the lower electrode 51. The bank BK also functions as a pixel separating film that serves as a partition between the pixels 2 (namely, the organic EL elements 50).

The bank BK has the opening BKA for every pixel 2. An exposed portion of the lower electrode 51 by the opening BKA is a light emitting region of each of the pixels 2.

The organic EL layer 52 is an organic layer (functional layer) including at least a light emitting layer, and may be a single-layer type including only a light emitting layer or a multilayer type including organic layers (functional layers) other than a light emitting layer.

The organic EL layer has a configuration in which, for example, a hole injecting layer, a hole transport layer, a light emitting layer, an electron transport layer, and an electron injecting layer are layered in the stated order from the lower electrode side. However, the above-mentioned layering order is an example on the assumption that the lower electrode 51 is the positive electrode and the upper electrode 53 is the negative electrode, so that the order of the layers forming the organic EL layer 52 is reversed when the lower electrode 51 is the negative electrode and the upper electrode 53 is the positive electrode.

The configuration of the organic EL layer 52 is not limited to the layer configuration exemplified above, and any desired layer configuration can be adopted according to required characteristics of the organic EL element 50. For example, one layer may have a plurality of functions. Furthermore, a carrier blocking layer may be appropriately provided between the layers.

In a case in which different colors are applied to the organic EL layer 52 by vapor deposition such that the organic EL elements 50 radiate light in different colors for every pixel 2, at least the light emitting layer in the organic EL layer 52 is formed in every region (pixel 2) surrounded by the bank BK.

A transparent electrode or a semitransparent electrode is preferably used for the lower electrode 51 and the upper electrode 53 described above. To improve color purity or luminous efficiency by a microcavity effect (interference effect), a semitransparent electrode is preferably used for an electrode on a side from which light is emitted during a single-sided display (the upper electrode 53 in the present embodiment).

For example, a metal thin film (metal semitransparent electrode) alone or a combination of a metal semitransparent electrode and a transparent electrode may be used for the semitransparent electrode described above.

Examples of the transparent electrode described above include, for example, ITO, IZO, $SnO_2$, and ZnO. Examples of the metal thin film (metal semitransparent electrode) include, for example, a thin film of a metal such as Al, Ag, Au, Mg, Ca, Li, and Cr or a thin film of an alloy containing such metals.

The transparent electrode described above preferably has a film thickness within a range of, for example, from 50 to 500 nm, more preferably, within a range of from 100 to 300 nm. In a case where the transparent electrode described above has a film thickness of, for example, greater than or equal to 50 nm, an increase in drive voltage caused by increased wiring resistance can be prevented. Furthermore, in a case where the transparent electrode described above has a film thickness of, for example, less than or equal to 500 nm, a decrease in luminance can be prevented without lowering a transmittance of light.

When the semitransparent electrode described above is the metal thin film (metal semitransparent electrode), the semitransparent electrode described above preferably has a film thickness within a range of, for example, from 5 to 30 nm. In a case where the semitransparent electrode described above has a film thickness of greater than or equal to 5 nm, light can be sufficiently reflected and effects of interference can also be sufficiently obtained. Furthermore, in a case where the semitransparent electrode described above has a film thickness of less than or equal to 30 nm, a decrease in luminance and luminous efficiency can be prevented without suddenly lowering a transmittance of light.

For example, an electrode material capable of efficiently injecting holes into the organic EL layer 52 and having a work function of greater than or equal to 4.5 is preferably used as a material for a positive electrode (the lower electrode 51 in the present embodiment). An electrode material capable of efficiently injecting electrons into the organic EL layer 52 and having a work function of less than or equal to 4.5 is preferably used as a material for a negative electrode (the upper electrode 53 in the present embodiment).

Examples of the electrode material having a work function of greater than or equal to 4.5 include, for example, a metal such as Au, ITO, IZO, $SnO_2$, and ZnO.

Examples of the electrode material having a work function of less than or equal to 4.5 include, for example, a metal such as Al, Li, and Ca and an alloy containing these metals such as a Mg—Ag alloy and a Li—Al alloy.

Note that a known material, which has been typically used for an organic EL layer, (for example, a known light emitting material, a known material with hole transport properties, a known material having electron transport properties, or the like) can be used for the organic EL layer 52.

Sealing Film 60

The sealing film 60 includes, for example, an inorganic sealing layer and an organic sealing layer. In an example illustrated in FIG. 1, the sealing film 60 has a configuration in which a first inorganic layer 61 (lower inorganic sealing layer, first inorganic sealing layer), an organic layer 62 (organic sealing layer), and a second inorganic layer 63 (upper inorganic sealing layer, second inorganic sealing layer) are layered on the upper electrode 53 in the stated order from the upper electrode 53 side.

The first inorganic layer 61 and the second inorganic layer 63 have a moisture-proof function of preventing entry of moisture and function as a barrier layer to prevent the organic EL element 50 from deteriorating due to moisture and oxygen.

The organic layer 62 is used as a buffer layer (stress relieving layer), relieves stress of the first inorganic layer 61 and the second inorganic layer 63 having great film stress, makes a display region including the plurality of pixels 2 level and fills pinholes by filling a step and foreign matter on surfaces of the organic EL element 50 and the bank BK, and further reduces occurrences of cracks in the second inorganic layer 63 during layering of the second inorganic layer 63 by making a primary coat of the second inorganic layer 63 level.

A transparent or semitransparent insulating material having transparency is used for each of the inorganic sealing layers and the organic sealing layer.

An inorganic sealing layer such as the first inorganic layer 61 and the second inorganic layer 63 can be formed of, for example, a silicon oxide ($SiO_x$) film, a silicon nitride ($SiN_x$) film, or an inorganic insulating film formed of a layered film of the silicon oxide film and the silicon nitride film, which are formed by CVD.

The organic layer 62 is a light-transmitting organic insulating film that is thicker than the first inorganic layer 61 and the second inorganic layer 63 and can be formed of photosensitive resin such as acrylic resin, epoxy resin, and silicone resin.

Cover Layer 70

The cover layer 70 is bonded to the sealing film 60 with, for example, an adhesive layer, which is not illustrated.

The cover layer 70 is a functional layer having at least one of a protection function, an optical compensation function, and a touch sensor function. The cover layer 70 may be a protection film that functions as a support body when a carrier substrate such as a glass substrate comes off, may be a hard coat layer such as a hard coat film, or may be a functional film such as a polarizing film and a touch sensor film.

Circuit Part

The circuit part includes a power source circuit unit (not illustrated) and a driver (not illustrated), such as a gate driver and a source driver, as well as a display control circuit unit (not illustrated) and a drive control circuit unit (not illustrated). The circuit part is formed of, for example, a circuit substrate, an integrated circuit (IC) chip, or the like.

Power source lines (not illustrated) such as high level power source lines and low level power source lines are connected to the power source circuit unit. A predetermined voltage is supplied from the power source circuit unit to each of the power source lines.

The power source circuit unit includes a high level power source circuit unit (not illustrated), a low level power source circuit unit (not illustrated), a logic power source circuit unit (not illustrated), and a light modulating unit layer drive power source circuit unit (not illustrated). The high level power source circuit unit applies voltage at a high level potential to the organic EL element 50 via the high level power source line. The low level power source circuit unit applies voltage at a low level potential to the organic EL element 50 via the low level power source line. The logic power source circuit unit applies voltage at a high level or low level potential as a logic power source potential to a high level logic power source line and a low level logic power source line included in the gate driver. The light modulating unit layer drive power source circuit unit applies voltage that drives the unit layer 20 to the unit layer 20.

The light modulating unit layer drive power source circuit unit includes a switch unit 4 that switches between states of the light modulating mirror layer 23 by reversing the polarity of the voltage applied to the light modulating unit layer 20.

DC voltage is used as the voltage applied to the light modulating unit layer 20. The light modulating unit layer 20 can switch between states of the light modulating mirror layer 23 as described below by reversing the polarity of the voltage applied to the light modulating unit layer 20 by the switch unit 4 as illustrated in FIGS. 2A and 2B, for example.

The display control circuit unit receives an input signal from an input signal supply source (not illustrated) outside and generates a control signal for controlling the organic EL display panel 7 from the input signal. The drive control circuit unit controls drive of each unit of the organic EL display device 1, such as control of each unit of the power source circuit unit and control of each unit of the driver.

Each of the gate wires or the like is connected to the gate driver, which is not illustrated here. The gate driver drives each of the gate wires on the basis of a control signal, such as a clock signal, received from the display control circuit part (not illustrated). The source driver is connected to each of the source wires and drives each of the source wires.

Image Display Method

Next, a method for displaying an image in the organic EL display device 1 according to the present embodiment will be described below with reference to FIGS. 1 to 4.

Figure 4:
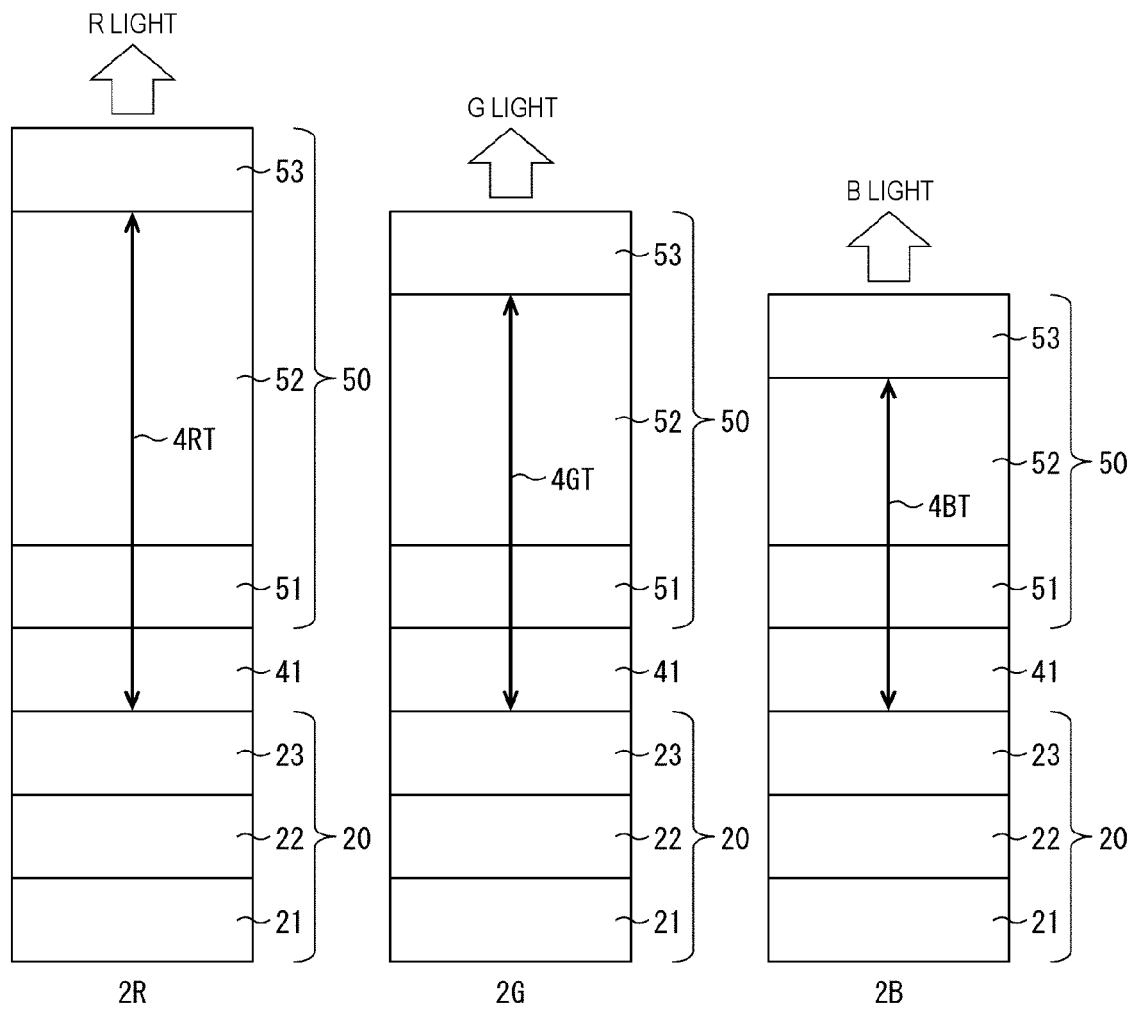
FIG. 4 is a diagram schematically illustrating an example of a method for displaying an image in a case of the top-emitting display in the organic EL display device according to the first embodiment of the disclosure and schematically illustrating a layered structure of a main portion of the organic EL display device mentioned above.

FIG. 3A is a diagram schematically illustrating a situation where a double-sided display is performed in the organic EL display device 1 according to the present embodiment. FIG. 3B is a diagram schematically illustrating a situation where a top-emitting display is performed in the organic EL display device 1 according to the present embodiment. FIG. 4 is a diagram schematically illustrating an example of a method for displaying an image in a case of the top-emitting display in the organic EL display device 1 according to the present embodiment and schematically illustrating a layered structure of a main portion of the organic EL display device 1 mentioned above. Note that FIGS. 3A, 3B, and 4 each illustrate a layered structure of a light emitting region (namely, the opening BKA of the bank BK) in each of the pixels 2, and FIG. 4 illustrates a simplified configuration of a main portion according to an optical path of the organic EL element 50.

As illustrated in FIGS. 3A and 3B, the organic EL display device 1 according to the present embodiment is a transflective (reflective transmission) display device that switches between a top-emitting single-sided display (light reflective display) emitting light from the cover layer 70 side (namely, the upper electrode 53 side) and a double-emitting double-sided display (light transmissive display, particularly, see-through display) emitting light from both sides of the cover layer 70 side and the support body 10 side (namely, the lower electrode 51 side) to perform display.

Principle of Light Modulation of Light Modulating Unit Layer 20

The light modulating unit layer 20 has a light reflective state in an initial state. In other words, the light modulating mirror layer 23 (for example, a Mg—Ni alloy) has a light reflective state in an initial state. As illustrated in FIG. 2A, when a negative voltage of about −5V, for example, is applied to the light modulating mirror layer 23 side, hydrogen ions in the ion storage layer 22a (for example, $H_xWO_3$) move into the light modulating mirror layer 23. As a result, while the ion storage layer 22a is dehydrogenated and, for example, $H_xWO_3$ becomes $WO_3$, the light modulating mirror layer 23 (for example, a Mg—Ni alloy) in a metal state is hydrogenated and brought into a non-metal state (for example, $H_xMgNi$) and thus changes to a transparent state. On the other hand, as illustrated in FIG. 2B, when a positive voltage of about 5V is applied to the light modulating mirror layer 23 side in this state, the light modulating mirror layer 23 is dehydrogenated and hydrogen ions in the light modulating mirror layer 23 move back into the ion storage layer 22a, whereas the light modulating mirror layer 23 returns to the original metal state and is thus brought into the light reflective state.

Note that the state of the light modulating mirror layer 23 is changed by the movement of ions, and the state above is maintained without application of voltage. Thus, voltage does not need to be always applied to the light modulating mirror layer 23.

Display Switching

According to the present embodiment, the light modulating unit layer 20 is brought into the light transmissive state by applying the negative voltage to the light modulating mirror layer 23 side as illustrated in FIG. 2A. Accordingly, as illustrated in FIG. 3A, light radiated to the cover layer 70 side of light emitted from the light emitting layer in the organic EL layer 52 is radiated to the outside from the cover layer 70 side while light radiated to the support body 10 side is transmitted through the light modulating unit layer 20 and is radiated to the outside from the support body 10 side. As a result, the double-emitting double-sided display is performed.

On the other hand, the light modulating unit layer 20 is brought into the light reflective state by applying the positive voltage to the light modulating mirror layer 23 side as illustrated in FIG. 2B. Accordingly, as illustrated in FIG. 3B, light radiated to the cover layer 70 side of light emitted from the light emitting layer in the organic EL layer 52 is radiated to the outside from the cover layer 70 side while light radiated to the support body 10 side is reflected by the light modulating unit layer 20, is transmitted through the organic EL layer 52, and is thus radiated to the outside from the cover layer 70 side. As a result, the top-emitting single-sided display is performed.

In this way, for the single-sided display, the light directly radiated from the organic EL layer 52 and the light reflected by the light modulating unit layer 20 are radiated to the same side with respect to the organic EL layer 52. Thus, the single-sided display enables brighter display than the double-sided display.

Note that in the case of the double-sided display, light radiated to the outside from the support body 10 side may decrease depending on a transmittance of the light modulating mirror layer 23. Thus, regardless of the double-sided display or the single-sided display performed on the organic EL display panel 7, the surface on the cover layer 70 side from which light is emitted without passing through the light modulating unit layer 20 is used as a main display surface.

Optical Interference

The organic EL display panel 7 described above improves color purity by an optical interference effect (microcavity effect), so that as illustrated in FIGS. 1 and 4, a distance (layer thickness) between the upper electrode 53 and the light modulating mirror layer 23 is preferably adjusted to the optimum thickness for every light emission color. In other words, as illustrated in FIGS. 1 and 4, the organic EL display panel 7 according to the present embodiment is preferably a microcavity (microresonator)-mode organic EL display panel. In the microcavity-mode organic EL display panel, emitted light is resonated due to multiple reflection, thereby causing a sharp light emission spectrum and amplified light emission intensity of a specific wavelength.

When such a resonance structure (microcavity structure) is introduced to an organic EL display panel, a transparent electrode has been typically used as an electrode on a light radiating surface side of a positive electrode and a negative electrode in organic EL elements and a reflective electrode has been typically used as an electrode on the opposite side in most cases to cause multiple reflection of light between the positive electrode and the negative electrode.

However, as described above, the organic EL display device 1 according to the present embodiment is a transflective display device that switches between the light reflective display (single-sided display) and the light transmissive display (double-sided display) to perform display, and performs the double-emitting double-sided display. Thus, for example, a semitransparent electrode is used as each of the lower electrode 51 and the upper electrode 53.

In this way, the semitransparent electrode is used as each of the lower electrode 51 and the upper electrode 53, so that optical interference may slightly occur but hardly occurs. Light is weak in the double-sided display, which is darker than single-sided light emission. Also, no optical interference occurs in the double-sided display, so that a light emission peak of a luminescent material for a light emitting layer is being observed.

In the present embodiment, it is assumed that, for example, the upper electrode 53 and the light modulating mirror layer 23 are resonance surfaces and a distance (cavity length) between the resonance surfaces is an optical path length, and light emitted from the light emitting layer is resonated by multiple reflection. This achieves, for example, the top-emitting single-sided display having high luminous efficiency and high color purity.

However, as described above, each of the layers in the light modulating unit layer 20 is a solid layer having a pair of electrode layers, and the lower electrode 51 is connected to the TFT 42. Thus, the light modulating unit layer 20 is not easily formed between the lower electrode 51 and the TFT layer 40.

Furthermore, in a case in which the light modulating unit layer 20 is provided in a layer below the TFT 42, an optical interference effect cannot be obtained with too much distance between the light modulating unit layer 20 and the lower electrode 51. In particular, the interlayer insulating film formed of the organic insulating film generally has a thickness of 1 μm to 3 μm. When the interlayer insulating film having such a great thickness is formed between the lower electrode 51 and the light modulating unit layer 20, an optical interference effect cannot be obtained.

In the present embodiment, as illustrated in FIG. 1, the light modulating unit layer 20 is disposed between the lower electrode 51 and the support body 10 (more specifically, between the TFT layer 40 and the support body 10), and the lower electrode 51 is formed in the same layer as the semiconductor layer 34, that is to say, formed directly on the inorganic insulating film 33 as the gate insulating film without providing the interlayer insulating film formed of the organic insulating film to shorten a distance between the lower electrode 51 and the light modulating mirror layer 23 as much as possible.

Thus, as illustrated in FIGS. 1 and 4, only the inorganic insulating film 41 formed of the inorganic insulating layers 31, 33 is provided between the lower electrode 51 and the light modulating unit layer 20 in the opening BKA of the bank BK as the light emitting region of each of the pixels 2.

In the present embodiment, the distance between the lower electrode 51 and the light modulating mirror layer 23 is shortened as much as possible, and, as described above, each of the layers in the light modulating unit layer 20 is disposed such that the light modulating mirror layer 23 is located closer to the organic EL element 50 side than the light transmissive electrode layer 21 side in consideration of light reflection by the light modulating unit layer 20.

In the present embodiment, as illustrated in FIG. 1, the TFT 42 adopts a bottom gate structure to shorten the distance between the lower electrode 51 and the light modulating mirror layer 23 as much as possible. However, the present embodiment is not limited to this, and the TFT 42 may have a top gate structure in which the gate electrode 32 is formed on the semiconductor layer 34 with the inorganic insulating layer 33 as the gate insulating film between the gate electrode 32 and the semiconductor layer 34.

As illustrated in FIG. 4, in the present embodiment, multiple reflection interference repeating reflection between the upper electrode 53 and the light modulating mirror layer 23 is performed to resonate and enhance light emitted from the light emitting layer. Then, luminance of light emission of the organic EL element 50 is increased by emitting only light that coincides with optical path lengths 4RT, 4GT, 4BT in respective colors between the upper electrode 53 and the light modulating mirror layer 23.

In the present embodiment, the optical interference effect can be obtained by designing the optical path lengths optimally. In the present embodiment, as illustrated in FIG. 4, the optical path lengths 4RT, 4GT, 4BT in the respective pixels 2R, 2G, 2B are changed by changing a layer thickness of the organic EL layer 52 for every pixel 2, for example.

The optical path lengths 4RT, 4GT, 4BT in the respective pixels 2R, 2G, 2B, namely, optical distances of optical paths in the microcavity structure in the respective pixels 2R, 2G, 2B are set to have a constant relationship with a wavelength of light to be resonated.

In other words, adjusting the distance between the upper electrode 53 and the light modulating mirror layer 23 in each of the pixels 2 amplifies intensity of light having a specific wavelength (light having a wavelength that coincides with an optical path length) due to resonance, and thus only the light having the specific wavelength is radiated from the upper electrode 53 side. On the other hand, intensity of the other light having a wavelength that does not coincide with the optical path length is reduced.

Therefore, the optical path lengths 4RT, 4GT, 4BT are set to optical path lengths (optical lengths) according to colors of light (namely, light emission colors in the pixels 2R, 2G, 2B) radiated from the upper electrode 53.

Note that when the display colors in the pixels 2 are R, G, B as described above, the optical path lengths 4RT, 4GT, 4BT are set to the optical path length 4RT>the optical path length 4GT>the optical path length 4BT in decreasing order of length as illustrated in FIG. 4, for example, so as to coincide with peak wavelengths of light in respective colors of R, G, B.

However, due to the presence of a plurality of optical path lengths in which the peak wavelengths of light in colors radiated from each of the pixels 2 resonate, an order is not necessarily the decreasing order of length described above and may include other relationships.

In the present embodiment, for example, a thickness of the organic EL layer 52 in the pixel 2R is set such that the distance between the upper electrode 53 and the light modulating mirror layer 23 in the pixel 2R is the optical path length 4RT in which a peak wavelength of R light (red light) resonates. A thickness of the organic EL layer 52 in the pixel 2G is set such that the distance between the upper electrode 53 and the light modulating mirror layer 23 in the pixel 2G is the optical path length 4GT in which a peak wavelength of G light (green light) resonates. A thickness of the organic EL layer 52 in the pixel 2B is set such that the distance between the upper electrode 53 and the light modulating mirror layer 23 in the pixel 2B is the optical path length 4BT in which a peak wavelength of B light (blue light) resonates.

As described above, in the present embodiment, part of light emitted from the luminescent material in each of the pixels 2 is directly radiated to the outside, but the other part of the light is radiated to the outside after multiple reflection occurs. In other words, the light radiated from each of the pixels 2 to the outside includes light emitted from the luminescent material to the outside through an electrode (the upper electrode 53 in the present embodiment) located opposite to the light modulating unit layer 20 with respect to the organic EL layer 52 while remaining unchanged, and includes light emitted from the luminescent material to the outside through an electrode (the upper electrode 53 in the present embodiment) located opposite to the light modulating unit 20 with respect to the organic EL layer 52 after multiple reflection occurs between the electrode and the light modulating unit layer 20.

Advantageous Effects

A typical top-emitting display device or a typical bottom-emitting display device without the light modulating unit layer 20 is only capable of single-sided display.

However, as described above, the present embodiment enables both of the single-sided display and the double-sided display by providing the light modulating unit layer 20 between the organic EL element 50 and a surface of the display device opposite to the side from which light is emitted (namely, the support body 10 in the present embodiment) and by electrically switching a transmittance of light in the light modulating unit layer 20. Thus, according to the present embodiment, the organic EL display device 1 offering selection of the double-sided display and the single-sided display, which is brighter than the double-sided display, can be provided.

As described above, in a display device including a plurality of pixels in comparison with an illumination device, a light emitting element (the organic EL element 50 in the present embodiment) is electrically connected to a drive element (the TFT 42 in the present embodiment) that drives the light emitting element. Thus, the light modulating unit layer 20 is not easily provided to be adjacent to the light emitting element and between a drive element layer (circuit layer) including the drive element and the light emitting element.

For this reason, although an illumination device without the pixels 2 performs the top-emitting single-sided light emission or a display device capable of switching between the bottom-emitting single-sided display and the double-emitting double-sided display is achieved by providing the light modulating unit layer opposite to the drive element layer with respect to the light emitting element, the display device capable of switching between the top-emitting single-sided display and the double-emitting double-sided display is not easily achieved.

As described above, the present embodiment can achieve the transflective (reflective transmission) display device capable of switching between the top-emitting single-sided display and the double-emitting double-sided display (preferably, see-through display) by using a transparent or semi-transparent layer for at least the light emitting region (preferably, the entire TFT layer 40) in a plan view (that is to say, when seen from a normal direction side of the organic EL display device 1) in the TFT layer 40 including the drive element (TFT 42) that drives the organic EL element 50 (light emitting element) and by providing the organic EL element 50 on the light modulating unit layer 20 in solid form with the TFT layer 40 therebetween. This enables display of information only on the front side when the information does not want to be disclosed on the back side.

Furthermore, the double-emitting display device cannot use the optical interference effect, so the luminous efficiency and color reproducibility are low.

The single-sided display enables brighter display than the double-sided display. However, a transparent electrode or a semitransparent electrode needs to be used as the lower electrode 51 and the upper electrode 53 of the organic EL element 50 (light emitting element) to achieve the double-sided display. In a case where an insulating film including an interlayer insulating film having a great thickness formed of an organic insulating film is provided between the organic EL element 50 and the light modulating unit layer 20, the optical interference effect is hardly promising even in the case where the semitransparent electrode is used as the lower electrode 51 and the upper electrode 53.

In the present embodiment, however, as described above, the optical interference effect can be obtained in the single-sided display by using the semitransparent electrode as the lower electrode 51 and the upper electrode 53, by providing no interlayer insulating film formed of the organic insulating film, and by forming the lower electrode 51 and the light modulating unit layer 20 to be adjacent to each other with only the inorganic insulating film 41 therebetween in the light emitting region, for example, by forming the lower electrode 51 in the same layer as the semiconductor layer 34. At this time, the lower electrode 51 can be brought closer to the light modulating mirror layer 23 as the reflective layer by forming the light modulating unit layer 20 such that the light modulating mirror layer 23 in the light modulating unit layer 20 is located closer to the organic EL element 50 side than the light transmissive electrode layer 21 side. Accordingly, a certain and stable optical interference effect can be obtained.

First Modification

Figure 5:
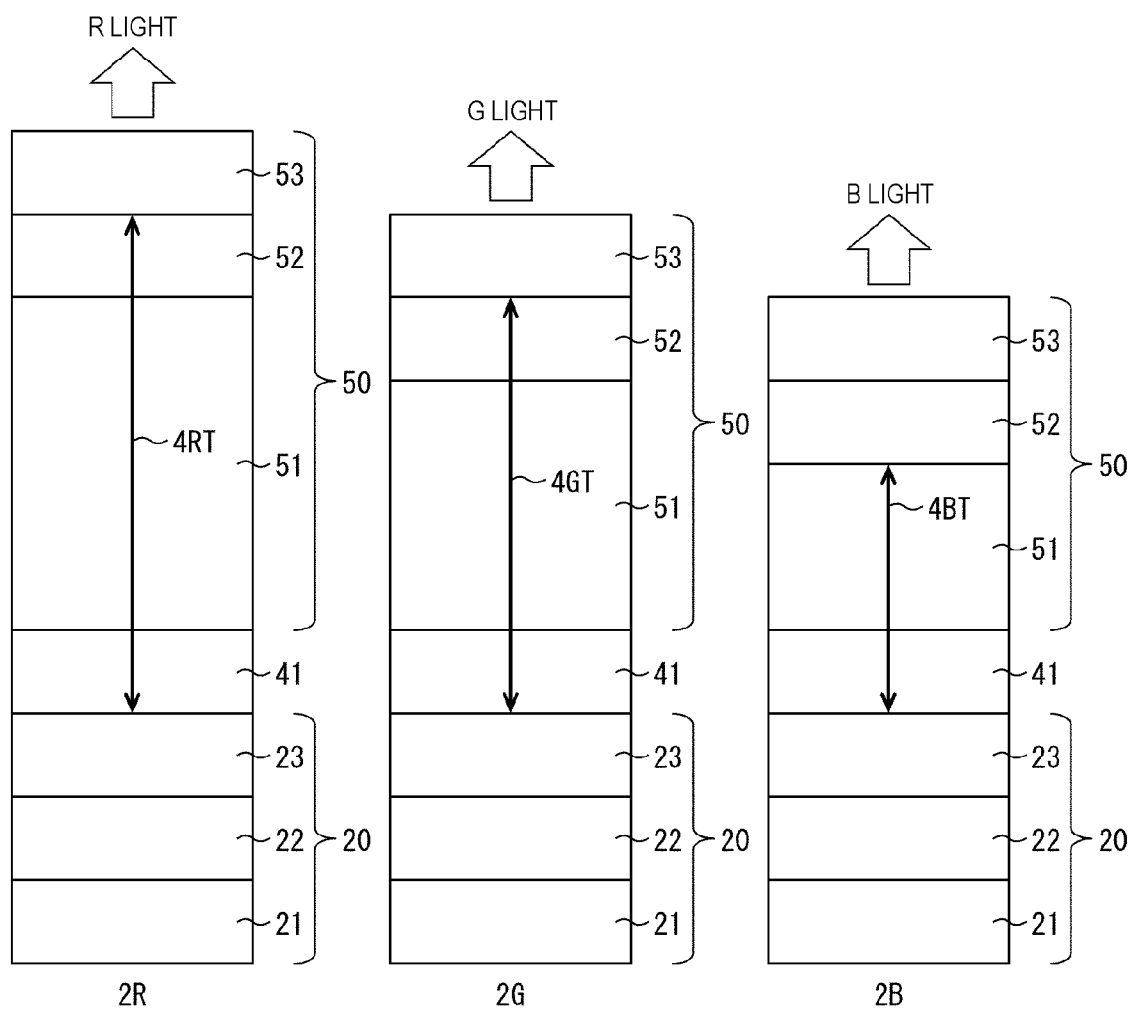
FIG. 5 is a diagram schematically illustrating another example of a method for displaying an image in a case of the top-emitting display in the organic EL display device according to the first embodiment of the disclosure and schematically illustrating a layered structure of a main portion of the organic EL display device mentioned above.

FIG. 5 is a diagram schematically illustrating another example of a method for displaying an image in a case of the top-emitting display in the organic EL display device 1 according to the present embodiment and schematically illustrating a layered structure of a main portion of the organic EL display device 1 mentioned above. FIG. 5, similar to FIG. 4, illustrates a simplified configuration of a main portion according to an optical path of the organic EL element 50.

In the present modification, as illustrated in FIG. 5, the optical path lengths 4RT, 4GT, 4BT in the respective pixels 2R, 2G, 2B are changed by changing a thickness of the lower electrode 51 instead of the organic EL layer 52 for every pixel 2.

The method for changing a thickness of the lower electrode 51 in each of the pixels 2 is not particularly restrictive. An electrode material having a desired thickness for every pixel 2 may be film-formed by vapor deposition, a printing method, or the like. After film formation of the electrode material by sputtering or the like, the electrode material may be patterned by photolithography, and a thickness of each layer made from the electrode material may be then adjusted to a desired thickness by ashing or the like.

Second Modification

In the present embodiment, as described above, the organic EL display device 1 that includes the organic EL display panel 7 including the organic EL element 50 (OLED element) as the light emitting element is described as an example of the display device according to the present embodiment. However, the display device according to the present embodiment is not limited to the organic EL display device 1 described above. Examples of the optical element include, for example, an electro-optic element having luminance and a transmittance controlled by current and an electro-optic element having luminance and a transmittance controlled by voltage.

Examples of the display device include, for example, an organic electro luminescence (EL) display including an organic light emitting diode (OLED) element, an EL display such as an inorganic EL display including an inorganic light emitting diode element (inorganic EL element), and a quantum-dot light emitting diode (QLED) display including a QLED element.

Second Embodiment

A description follows regarding another embodiment of the disclosure, with reference to mainly FIGS. 6 to 9. The present embodiment will be described by stating the differences between the present embodiment and the first embodiment, and members having the same function as the members stated in the first embodiment are appended with the same reference signs, and the description thereof is omitted. The same modifications as those of the first embodiment may also be applied to the present embodiment.

Schematic Configuration of Organic EL Display Device

Figure 6:
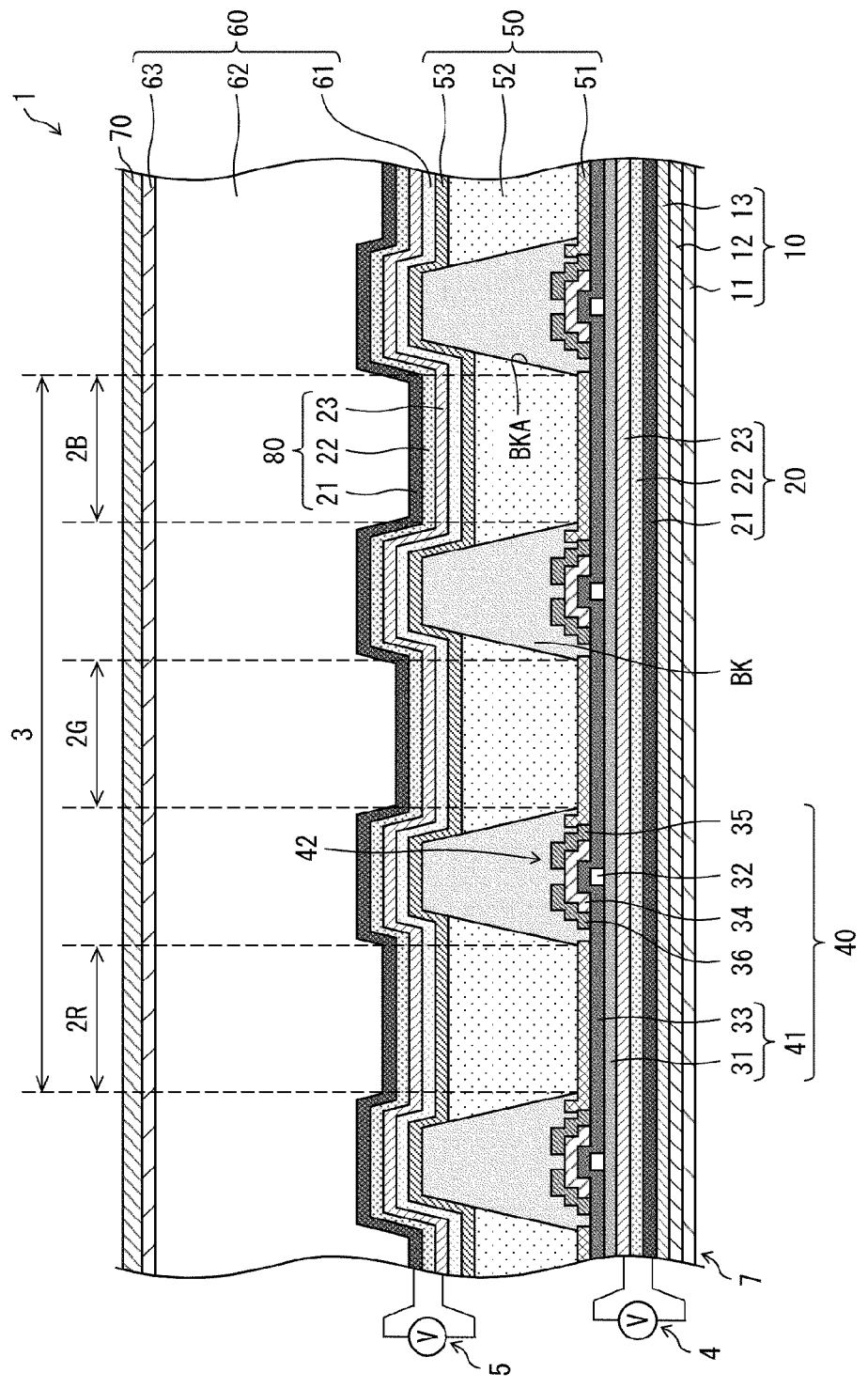
FIG. 6 is a cross-sectional view illustrating an example of a schematic configuration of a main portion of an organic EL display device according to a second embodiment of the disclosure.

FIG. 6 is a cross-sectional view illustrating an example of a schematic configuration of a main portion of an organic EL display device 1 according to the present embodiment. FIGS. 7A to 7C are diagrams schematically illustrating a layered structure of each of light modulating unit layers 20, 80.

The organic EL display device 1 according to the present embodiment is the same as the organic EL display device 1 according to the first embodiment except for following points.

As illustrated in FIG. 6, the organic EL display device 1 according to the present embodiment includes a light modulating unit layer 80 (second light modulating unit layer, light modulating element) between the first inorganic layer 61 and the organic layer 62 in the sealing film 60. A light transmissive state and a light reflective state are electrically switched in the light modulating unit layer 80 independent of the light modulating unit layer 20. In the organic EL display device 1 according to the present embodiment, the light modulating unit layer drive power source circuit unit further includes a switch unit 5 (second switch unit) that switches between states (in other words, light transmissive state and light reflective state, namely, light transmittance) of the light modulating mirror layer 23 in the light modulating unit layer 80 by reversing the polarity of voltage applied to the light modulating unit layer 80.

Thus, the organic EL display panel 7 according to the present embodiment has a configuration in which the light modulating unit layer 20 (first light modulating unit layer), the Thin Film Transistor (TFT) layer 40, the organic EL element 50 and the bank BK, the first inorganic layer 61, the light modulating unit layer 80 (second light modulating unit layer), the organic layer 62, the second inorganic layer 63, and the cover layer 70 are provided on the support body 10 in the stated order from the support body 10 side.

Light Modulating Unit Layer 80 and Switch Unit 5

The light modulating unit layer 80 is a light modulating unit in which a light reflective state (light reflective mode, mirror state) reflecting light and a light transmissive state (light transmissive mode, for example, transparent state) allowing light to be transmitted are electrically switched therebetween by voltage applied to the light modulating unit layer 80.

As illustrated in FIGS. 6 and 8A to 8C, the light modulating unit layer 80 has the same configuration as that of the light modulating unit layer 20. However, in the present embodiment, the light modulating unit layers 20, 80 have configurations in which layers forming the light modulating unit layers 20, 80 are layered in reverse order.

In other words, in the present embodiment, the light modulating unit layer 80 has a configuration in which the light modulating mirror layer 23 (second light modulating layer), the intermediate layer 22, and the light transmissive electrode layer 21 are layered in the stated order from the first inorganic layer 61 side to shorten a distance between the upper electrode 53 and the light modulating mirror layer 23 in the light modulating unit layer 80 as much as possible in consideration of light reflection.

Note that also in the present embodiment, the intermediate layer 22 has a configuration in which, for example, the ion storage layer 22a, the solid electrolytic layer 22b, the buffer layer 22c, and the catalytic layer 22d are layered in the stated order from the light transmissive electrode layer 21 side or a configuration in which, for example, the ion storage layer 22a, the solid electrolytic layer 22b, and the catalytic layer 22d are layered in the stated order from the light transmissive electrode layer 21 side.

FIGS. 7A to 7C exemplify, as an example, a case in which the intermediate layer 22 includes the ion storage layer 22a, the solid electrolytic layer 22b, the buffer layer 22c, and the catalytic layer 22d layered in the stated order from the light transmissive electrode layer 21 side.

Thus, the light modulating unit layer 80 has a configuration in which the light modulating mirror layer 23, the catalytic layer 22d, the buffer layer 22c, the solid electrolytic layer 22b, the ion storage layer 22a, and the light transmissive electrode layer 21 are layered in the stated order from the first inorganic layer 61 side.

FIGS. 7A to 7C exemplify, as an example, a case in which the light transmissive electrode layer 21, the ion storage layer 22a, the solid electrolytic layer 22b, the buffer layer 22c, the catalytic layer 22d, and the light modulating mirror layer 23 are respectively ITO, $WO_3$, $Ta_2O_5$, Al, Pd, and a Mg—Ni alloy in each of the light modulating unit layers 20, 80.

DC voltage is used as the voltage applied to the light modulating unit layer 80, similarly to the light modulating unit layer 20. The light modulating unit layer 80 can switch between states of the light modulating mirror layer 23 in the light modulating unit layer 80 by reversing the polarity of the voltage applied to the light modulating unit layer 80 by the switch unit 5 as illustrated in FIGS. 7A to 7C, for example.

Image Display Method

Next, a method for displaying an image in the organic EL display device 1 according to the present embodiment will be described below with reference to FIGS. 6 to 9.

Figure 9:
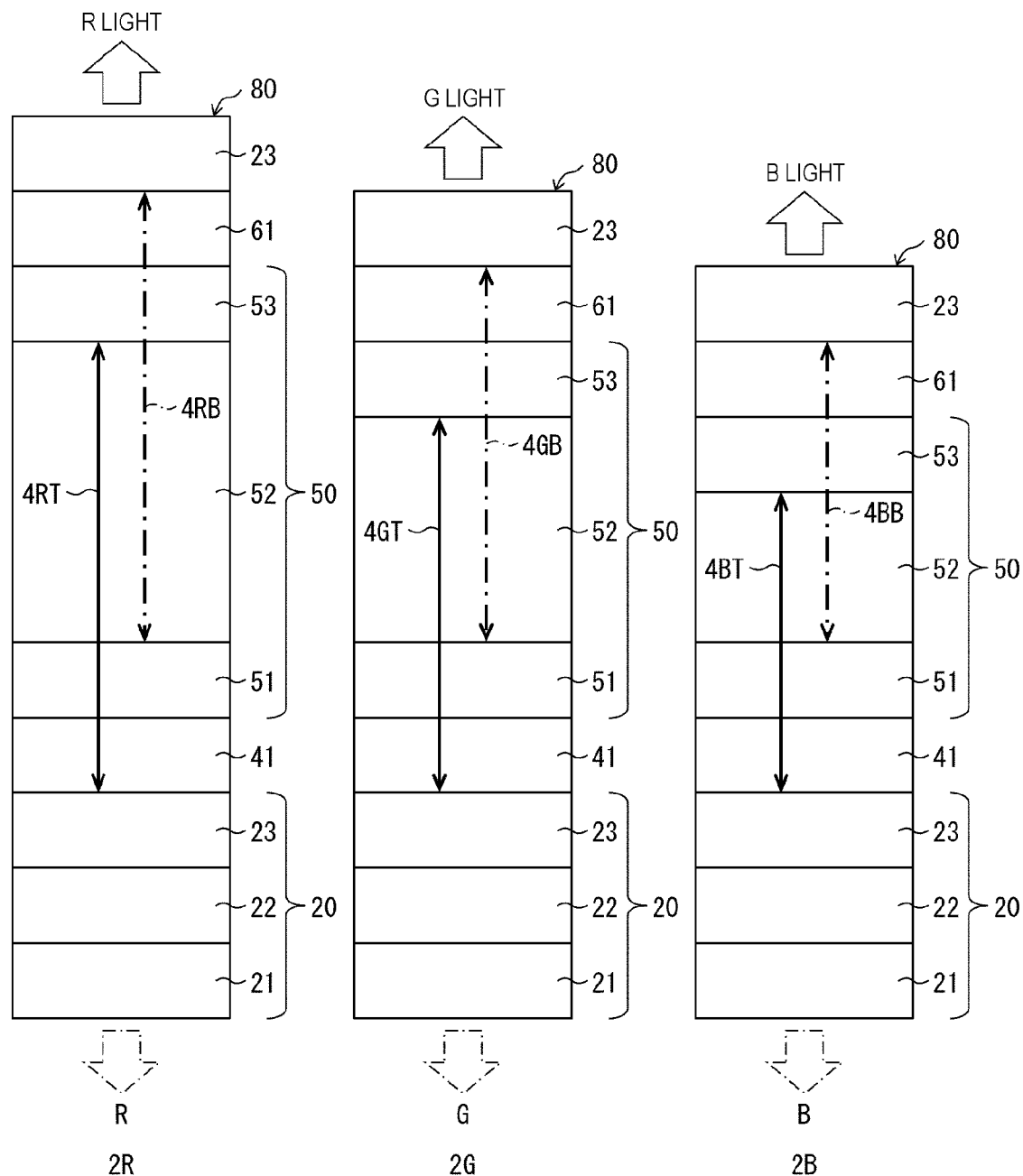
FIG. 9 is a diagram schematically illustrating an example of a method for displaying an image in a case of the top-emitting display or the bottom-emitting display in the organic EL display device according to the second embodiment of the disclosure and schematically illustrating a layered structure of a main portion of the organic EL display device mentioned above.

FIG. 8A is a diagram schematically illustrating a situation where a double-sided display is performed in the organic EL display device 1 according to the present embodiment. FIG. 8B is a diagram schematically illustrating a situation where a top-emitting display is performed in the organic EL display device 1 according to the present embodiment. FIG. 8C is a diagram schematically illustrating a situation where a bottom-emitting display is performed in the organic EL display device 1 according to the present embodiment. FIG. 9 is a diagram schematically illustrating an example of a method for displaying an image in a case of the top-emitting display or the bottom-emitting display in the organic EL display device 1 according to the present embodiment and schematically illustrating a layered structure of a main portion of the organic EL display device 1 mentioned above. Note that FIGS. 8A to 8C and 9 each illustrate a layered structure of a light emitting region (namely, the opening BKA of the bank BK) in each of the pixels 2, and FIG. 9 illustrates a simplified configuration of a main portion according to an optical path of the organic EL element 50.

The organic EL display device 1 according to the present embodiment, which is similar to the organic EL display device 1 according to the first embodiment, is a transflective (reflective transmission) display device that switches between the light reflective display (single-sided display) and the light transmissive display (double-sided display, particularly, see-through display) to perform display.

However, the organic EL display device 1 according to the present embodiment includes the light modulating unit layer 80 located opposite to the light modulating unit layer 20 with respect to the organic EL element 50, and switches between the double-emitting double-sided display (light transmissive display) illustrated in FIG. 8A, the top-emitting single-sided display (light reflective display) illustrated in FIG. 8B, and the bottom-emitting single-sided display (light reflective display) illustrated in FIG. 8C.

Principle of Light Modulation of Light Modulating Unit Layer 80

As described above, the light modulating unit layer 80 has the same configuration as that of the light modulating unit layer 20 except for that the layers in the light modulating unit layer 80 are layered in vertically reverse layering order of the light modulating unit layer 20. Thus, the principle of light modulation of the light modulating unit layer 80 is the same as that of the light modulating unit layer 20, and the light modulating unit layer 20 can be replaced with the light modulating unit layer 80 in the description of the principle of light modulation of the light modulating unit layer 20 in the first embodiment.

Display Switching

According to the present embodiment, the light modulating unit layers 20, 80 are brought into the light transmissive state by applying the negative voltage to the light modulating mirror layer 23 side of each of the light modulating unit layers 20, 80 as illustrated in FIG. 7A. Accordingly, as illustrated in FIG. 8A, light radiated to the cover layer 70 side of light emitted from the light emitting layer in the organic EL layer 52 is transmitted through the light modulating unit layer 80 and is radiated to the outside from the cover layer 70 side while light radiated to the support body 10 side is transmitted through the light modulating unit layer 20 and is radiated to the outside from the support body 10 side. As a result, the double-emitting double-sided display is performed.

As illustrated in FIG. 7B, the light modulating unit layer 20 is brought into the light reflective state by applying the positive voltage to the light modulating mirror layer 23 side in the light modulating unit layer 20. Meanwhile, the light modulating unit layer 80 is brought into the light transmissive state by applying the negative voltage to the light modulating mirror layer 23 side in the light modulating unit layer 80. Accordingly, as illustrated in FIG. 8B, light radiated to the cover layer 70 side of light emitted from the light emitting layer in the organic EL layer 52 is transmitted through the light modulating unit layer 80 and is radiated to the outside from the cover layer 70 side while light radiated to the support body 10 side is reflected by the light modulating unit layer 20, is transmitted through the organic EL layer 52 and the light modulating unit layer 80, and is thus radiated to the outside from the cover layer 70 side. As a result, the top-emitting single-sided display is performed.

As illustrated in FIG. 7C, the light modulating unit layer 20 is brought into the light transmissive state by applying the negative voltage to the light modulating mirror layer 23 side in the light modulating unit layer 20. Meanwhile, the light modulating unit layer 80 is brought into the light reflective state by applying the positive voltage to the light modulating mirror layer 23 side in the light modulating unit layer 80. Accordingly, as illustrated in FIG. 8C, light radiated to the support body 10 side of light emitted from the light emitting layer in the organic EL layer 52 is transmitted through the light modulating unit layer 20 and is radiated to the outside from the support body 10 side while light radiated to the cover layer 70 side is reflected by the light modulating unit layer 80, is transmitted through the organic EL layer 52 and the light modulating unit layer 20, and is thus radiated to the outside from the support body 10 side. As a result, the bottom-emitting single-sided display is performed.

In this way, for the single-sided display, the light directly radiated from the organic EL layer 52 and the light reflected by the light modulating unit layer having the light reflective state of the light modulating unit layers 20, 80 are radiated to the same side with respect to the organic EL layer 52. Thus, the single-sided display enables brighter display than the double-sided display.

Optical Interference

As in the first embodiment, the organic EL display panel 7 according to the present embodiment is preferably a microcavity (microresonator)-mode organic EL display panel.

The organic EL display panel 7 described above improves color purity by an optical interference effect (microcavity effect). Accordingly, as illustrated in FIGS. 6 and 9, a distance (layer thickness) between the upper electrode 53 and the light modulating mirror layer 23 in the light modulating unit layer 20 is preferably adjusted to the optimum thickness for every light emission color while a distance (layer thickness) between the lower electrode 51 and the light modulating mirror layer 23 in the light modulating unit layer 80 is preferably adjusted to the optimum thickness for every light emission color.

In the present embodiment, for the top-emitting display, as indicated by double-pointed arrows in solid lines in FIG. 9, multiple reflection interference repeating reflection between the upper electrode 53 and the light modulating mirror layer 23 in the light modulating unit layer 20 is performed to resonate and enhance light emitted from the light emitting layer. Then, as indicated by single-pointed arrows in solid lines in FIG. 9, luminance of light emission of the organic EL element 50 is increased by emitting only light that coincides with the optical path lengths 4RT, 4GT, 4BT in respective colors between the upper electrode 53 and the light modulating mirror layer 23 in the light modulating unit layer 20.

On the other hand, for the bottom-emitting display, as indicated by double-pointed arrows in dot-and-dash lines in FIG. 9, multiple reflection interference repeating reflection between the lower electrode 51 and the light modulating mirror layer 23 in the light modulating unit layer 80 is performed to resonate and enhance light emitted from the light emitting layer. Then, as indicated by single-pointed arrows in dot-and-dash lines in FIG. 9, luminance of light emission of the organic EL element 50 is increased by emitting only light that coincides with the optical path lengths 4RB, 4GB, 4BB in respective colors between the lower electrode 51 and the light modulating mirror layer 23 in the light modulating unit layer 80.

Therefore, in the present embodiment, a thickness of the organic EL layer 52 in each of the pixels 2 is set such that the distance between the upper electrode 53 and the light modulating mirror layer 23 in the light modulating unit layer 20 and the distance between the lower electrode 51 and the light modulating mirror layer 23 in the light modulating unit layer 80 in each of the pixels 2 have a length suitable for resonance of a peak wavelength of light in color radiated from each of the pixels 2.

Thus, in the present embodiment, a thickness of the organic EL layer 52 in the pixel 2R is set such that the distance between the upper electrode 53 and the light modulating mirror layer 23 in the light modulating unit layer 20 and the distance between the lower electrode 51 and the light modulating mirror layer 23 in the light modulating unit layer 80 in each of the pixels 2R are respectively set to the optical path length 4RT and the optical path length 4RB in which the peak wavelength of R light resonates. A thickness of the organic EL layer 52 in the pixel 2G is set such that the distance between the upper electrode 53 and the light modulating mirror layer 23 in the light modulating unit layer 20 and the distance between the lower electrode 51 and the light modulating mirror layer 23 in the light modulating unit layer 80 in each of the pixels 2G are respectively set to the optical path length 4GT and the optical path length 4GB in which the peak wavelength of G light resonates. A thickness of the organic EL layer 52 in the pixel 2B is set such that the distance between the upper electrode 53 and the light modulating mirror layer 23 in the light modulating unit layer 20 and the distance between the lower electrode 51 and the light modulating mirror layer 23 in the light modulating unit layer 80 in each of the pixels 2B are respectively set to the optical path length 4BT and the optical path length 4BB in which the peak wavelength of B light resonates.

Third Embodiment

Figure 10:
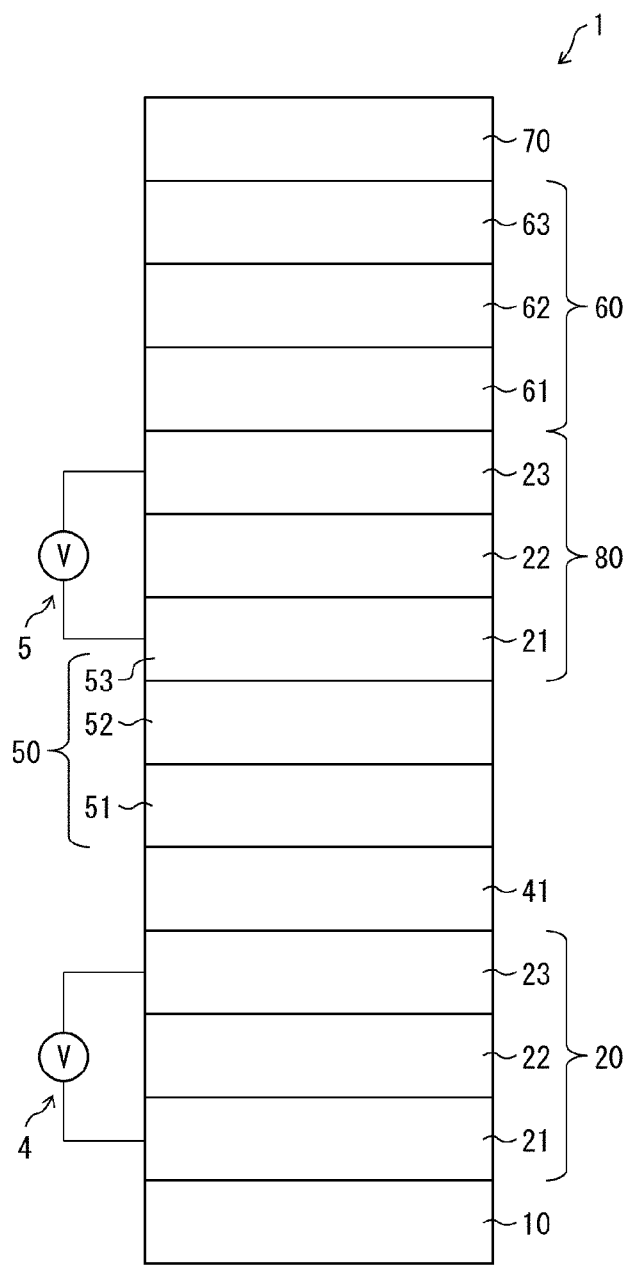
FIG. 10 is a diagram schematically illustrating an example of a schematic configuration of a main portion of an organic EL display device according to a third embodiment of the disclosure.

A description follows regarding yet another embodiment of the disclosure, with reference mainly to FIG. 10. The present embodiment will be described by stating by the differences between the present embodiment and the first and second embodiments, and members having the same function as the members stated in the first embodiment are appended with the same reference signs, and the description thereof is omitted. The same modifications as those of the first and second embodiments may also be applied to the present embodiment.

Schematic Configuration of Organic EL Display Device

FIG. 10 is a diagram schematically illustrating an example of a schematic configuration of a main portion of an organic EL display device 1 according to the present embodiment. Note that FIG. 10 illustrates a layered structure of a light emitting region (namely, the opening BKA of the bank BK) in each of the pixels 2.

The organic EL display device 1 according to the present embodiment is the same as the organic EL display device 1 according to the second embodiment except for following points.

As illustrated in FIG. 10, the organic EL display device 1 according to the present embodiment includes a light modulating unit 80 (second light modulating unit layer) between the organic EL element 50 and the sealing film 60 (namely, between the upper electrode 53 and the first inorganic layer 61), and the upper electrode 53 functions as the light transmissive electrode layer 21 in the light modulating unit layer 80.

In other words, the present embodiment has a configuration in which the light modulating unit layer 80 is directly provided on the upper electrode 53 without an insulating layer such as the first inorganic layer 61 between the light modulating unit layer 80 and the upper electrode 53. Thus, in the present embodiment, the light modulating unit layer 80 has a configuration in which the light transmissive electrode layer 21, the intermediate layer 22, and the light modulating mirror layer 23 are layered in the stated order from the organic EL element 50 side.

The light transmissive electrode layer 21 in the light modulating unit layer 80 and the upper electrode 53 in the organic EL element 50 may be separately provided, but can be formed as one layer by using the same material. FIG. 10 exemplifies, as an example, a case in which the upper electrode 53 and the light transmissive electrode layer 21 are an upper electrode-and-transparent electrode layer (that is to say, an upper electrode-and-transparent electrode layer is provided as the upper electrode 53 and the light transmissive electrode layer 21).

The upper electrode 53 (which is the upper electrode-and-transparent electrode layer and also the light transmissive electrode layer 21 in the present embodiment) is a common electrode common to the pixels 2, and voltage applied to the upper electrode 53 is set to a fixed voltage (for example, ground potential).

Thus, in the present embodiment, a negative voltage of about −5V or a positive voltage of about 5V, for example, is applied to the upper electrode 53 on the light modulating mirror layer 23 side to modulate light of the light modulating unit layer 80.

Image Display Method

A method for displaying an image in the organic EL display device 1 according to the present embodiment is the same as the method for displaying an image in the organic EL display device 1 according to the second embodiment.

Also in the present embodiment, the light modulating unit layer 80 is provided opposite to the light modulating unit layer 20 with respect to the organic EL element 50, so that each of the light modulating unit layers 20, 80 is brought into the light transmissive state by applying the negative voltage to the light modulating mirror layer 23 side of each of the light modulating unit layers 20, 80. This enables the double-emitting double-sided display. While the light modulating unit layer 20 is brought into the light reflective state by applying the positive voltage to the light modulating mirror layer 23 side of the light modulating unit layer 20, the light modulating unit layer 80 is brought into the light transmissive state by applying the negative voltage to the light modulating mirror layer 23 side of the light modulating unit layer 80, which enables the top-emitting single-sided display. While the light modulating unit layer 20 is brought into the light transmissive state by applying the negative voltage to the light modulating mirror layer 23 side of the light modulating unit layer 20, the light modulating unit layer 80 is brought into the light reflective state by applying the positive voltage to the light modulating mirror layer 23 side of the light modulating unit layer 80, which enables the bottom-emitting single-sided display.

Also in the present embodiment, luminance of light emission of the organic EL element 50 can be increased by setting the upper electrode 53 and the light modulating mirror layer 23 in the light modulating unit layer 20 as resonance surfaces for the top-emitting display, by setting the lower electrode 51 and the light modulating mirror layer 23 in the light modulating unit layer 80 as resonance surfaces for the bottom-emitting display, and by performing multiple reflection interference between the respective resonance surfaces to resonate and enhance light emitted from the light emitting layer.

Therefore, in the present embodiment, in consideration of a layering order of layers (namely, difference in the layered structure in the organic EL display device 1 between the present embodiment and the second embodiment), a thickness of the organic EL layer 52 in the pixel 2R is set such that the optical path lengths 4RT, 4RB each have a length suitable for resonance of the R light, a thickness of the organic EL layer 52 in the pixel 2G is set such that the optical path lengths 4GT, 4GB each have a length suitable for resonance of the G light, and a thickness of the organic EL layer 52 in the pixel 2B is set such that the optical path lengths 4BT, 4BB each have a length suitable for resonance of the B light.

Fourth Embodiment

A description follows regarding yet another embodiment of the disclosure, mainly on the basis of FIGS. 11A and 11B to FIGS. 12A and 12B. Members having the same function as the members stated in the first to third embodiments are appended with the same reference signs, and the description thereof is omitted.

In the present embodiment, a use manner of the organic EL display device 1 according to the third embodiment in a case in which the organic EL display device 1 is a folding flexible display device (foldable display) will be described.

Figure 11A:
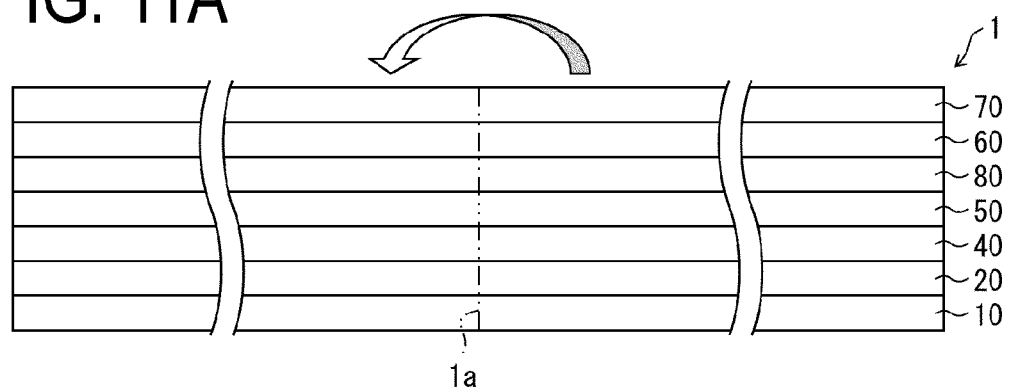
FIG. 11A is a diagram schematically illustrating a situation where an organic EL display device according to a fourth embodiment of the disclosure is being folded and schematically illustrating an example of a layered structure of the organic EL display device.
Figure 11B:
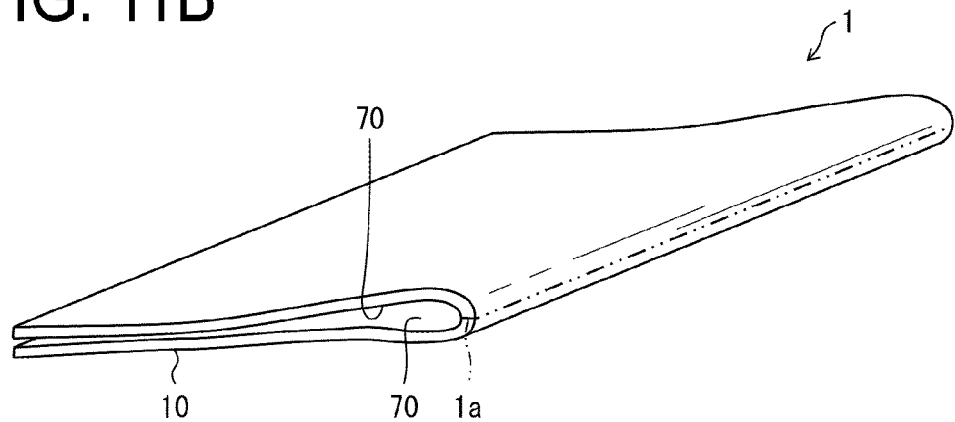
FIG. 11B is a perspective view schematically illustrating a state where the organic EL display device mentioned above is folded up.
Figure 12:
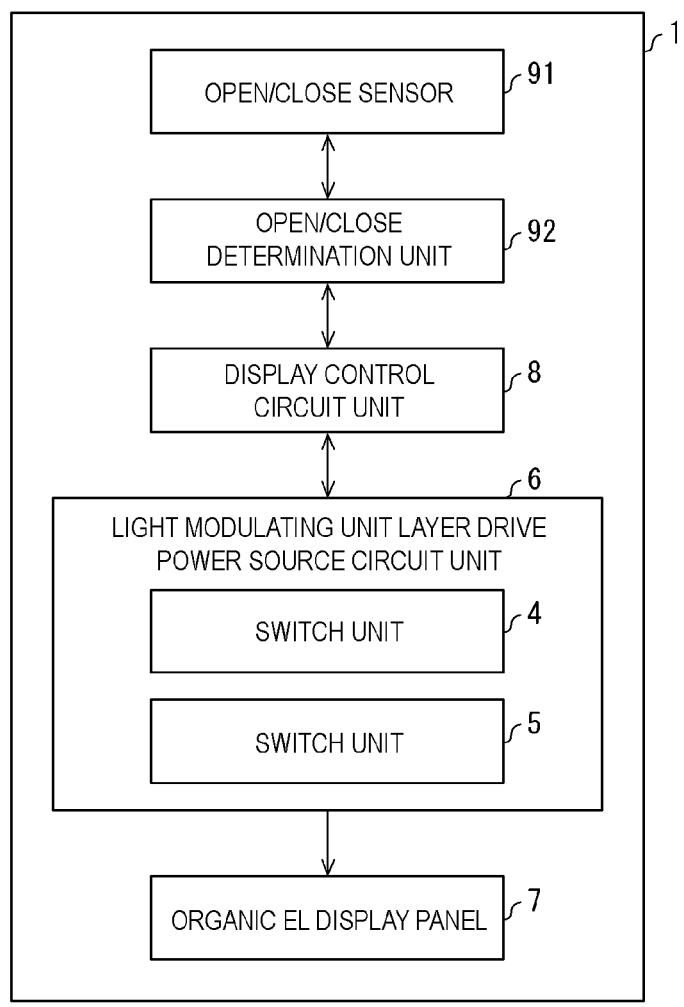
FIG. 12 is a block diagram illustrating an example of a schematic configuration of a main portion of the organic EL display device according to the fourth embodiment of the disclosure.

FIG. 11A is a diagram schematically illustrating a situation where the organic EL display device 1 according to the present embodiment is being folded and schematically illustrating an example of a layered structure of the organic EL display device 1. FIG. 11B is a perspective view schematically illustrating a state where the organic EL display device 1 according to the present embodiment is folded up. FIG. 12 is a block diagram illustrating an example of a schematic configuration of a main portion of the organic EL display device 1 according to the present embodiment. FIGS. 13A and 13B are diagrams each schematically illustrating an example of a display manner of the organic EL display device 1 according to the present embodiment. Note that FIGS. 13A and 13B illustrate a layered structure of a light emitting region (namely, the opening BKA of the bank BK) in each of the pixels 2. FIGS. 11A, 13A, and 13B illustrate that the organic EL element 50 and the light modulating unit layer 80 are different blocks for simplification of the diagrams. However, as illustrated in FIG. 10, one electrode layer may function as the upper electrode 53 in the organic EL element 50 and the light transmissive electrode layer 21 in the light modulating unit layer 80.

FIG. 11A illustrates, as an example, a situation where the organic EL display device 1 is folded inward at a bent portion 1a indicated by a chain double-dashed line in FIG. 11A such that the cover layer 70 of the organic EL display panel 7 is located inward and the support body 10 is located outward (that is to say, the organic EL display device 1 is folded such that the support body 10 faces outward). FIG. 11B illustrates, as an example, a situation where the organic EL display device 1 is folded inward at the bent portion 1a as illustrated in FIG. 11A.

However, the present embodiment is not limited to this, and the organic EL display device 1 can be folded in a direction opposite to that in FIGS. 11A and 11B (that is to say, the organic EL display device 1 can be folded such that the support body 10 faces the back side). In other words, the organic EL display device 1 may be folded outward such that the support body 10 of the organic EL display panel 7 is located inward and the cover layer 70 is located outward.

As illustrated in FIG. 12, the organic EL display device 1 according to the present embodiment includes a light modulating unit layer drive power source circuit unit 6 as a light modulating unit layer drive power source circuit unit including switch units 4, 5 and also includes a drive control circuit unit 8 as a drive control circuit unit. The organic EL display device 1 according to the present embodiment further includes open/close sensors 91 and an open/close determination unit 92.

The light modulating unit layer drive power source circuit unit 6 applies voltage for driving the light modulating unit layers 20, 80 to the light modulating unit layers 20, 80. The switch unit 4 switches between states of the light modulating mirror layer 23 by reversing the polarity of the voltage applied to the light modulating unit layer 20. The switch unit 5 switches between states of the light modulating mirror layer 23 in the light modulating unit layer 80 by reversing the polarity of the voltage applied to the light modulating unit layer 80.

The drive control circuit unit 8 controls drive of each unit of the organic EL display device 1, such as control of each unit of the power source circuit unit including the light modulating unit layer drive power source circuit unit 6 and control of each unit of the driver.

The open/close sensor 91 detects an open/close state of the organic EL display device 1, namely, folding (bending, curving) and unfolding (extending) of the organic EL display device 1.

The open/close sensor 91 may be a contact sensor detecting contact between parts of the bent organic EL display panel 7, and may be a proximity sensor detecting that parts of the bent organic EL display panel 7 are closer to each other than a preset threshold value.

As long as the open/close sensors 91 are located on both front and back surfaces of the organic EL display panel 7 where parts of the bent organic EL display panel 7 face each other when the organic EL display device 1 is bent (that is to say, when the organic EL display panel 7 is bent), the number and arrangement position of the open/close sensors 91 are not particularly limited. When the open/close sensors 91 are contact sensors, the open/close sensors 91 are located on each of the front and back surfaces of the organic EL display panel 7 where parts of the bent organic EL display panel 7 contact each other.

For example, an optical sensor, a pressure sensor, a magnetic sensor, or the like can be used as the open/close sensor 91. When the open/close sensors 91 are optical sensors, for example, the open/close sensors 91 can detect an open/close state of the organic EL display panel 7 by providing a light emitting element and a light receiving element in positions where parts of the bent organic EL display panel 7 face each other.

The open/close sensors 91 output an output value of the open/close sensors 91 according to an open/close state of the organic EL display device 1 (organic EL display panel 7) to the open/close determination unit 92 based on instructions from the open/close determination unit 92.

The open/close determination unit 92 operates each of the open/close sensors 91 at predetermined timing and acquires an output value of each of the open/close sensors 91 as an output of each of the open/close sensors 91. The open/close determination unit 92 acquires an output value of each of the open/close sensors 91 from each of the open/close sensors 91 at every fixed period.

The open/close determination unit 92 compares magnitudes of an output value of each of the open/close sensors 91 and a threshold value and determines an open/close state of the organic EL display device 1. At this time, the open/close determination unit 92 determines whether the organic EL display panel 7 is unfolded, folded outward, or folded inward from an output value of each of the open/close sensors 91 because the open/close sensors 91 are provided on the front and back surfaces of the organic EL display panel 7.

The open/close determination unit 92 outputs a signal indicating a determination result to the drive control circuit unit 8. Based on the determination result of the open/close determination unit 92, the drive control circuit unit 8 outputs a signal for driving the light modulating unit layer drive power source circuit unit 6 such that light is not radiated (emitted) from inward surfaces of the organic EL display panel 7 being the inside (back) and facing each other when the organic EL display device 1 is bent and such that light is radiated (emitted) from outward surfaces of the organic EL display panel 7 being the outside (front) and located opposite to the inward surfaces.

Based on the signal output from the drive control circuit unit 8 based on the detection result of the open/close sensors 91, the light modulating unit layer drive power source circuit unit 6 causes the switch units 4, 5 to switch the polarity of voltage applied to the modulating light unit layers 20, 80 such that light is not radiated (emitted) from the inward surfaces of the organic EL display panel 7 and light is radiated (emitted) from the outward surfaces, and applies voltage necessary for driving the light modulating unit layers 20, 80 to the light modulating unit layers 20, 80.

As a result, when the organic EL display device 1 is folded up, the organic EL display device 1 automatically performs non-display on the inward surfaces of the organic EL display panel 7 and display only on the outward surfaces.

FIG. 13A illustrates a use manner of the organic EL display device 1 when the organic EL display panel 7 is folded inward at the bent portion 1*a* such that the cover layer 70 is located inward and the support body 10 is located outward.

FIG. 13B illustrates a use manner of the organic EL display device 1 when the organic EL display panel 7 is folded outward at the bent portion 1*a* such that the support body 10 is located inward and the cover layer 70 is located outward.

As illustrated in FIG. 13A, when the organic EL display panel 7 is folded inward, the organic EL display panel 7 has a cross-sectional structure in which the cover layer 70, the sealing film 60, the light modulating unit layer 80 (second light modulating unit layer), the organic EL element 50, the inorganic insulating film 41, the light modulating unit layer 20 (first light modulating unit layer), and the support body 10 are layered in the stated order from the bent portion 1*a* to the outside with respect to the bent portion 1*a* in the light emitting region.

In this case, as illustrated in FIG. 13A, of the light modulating unit layers 20 and 80, the light modulating unit layer 20 located outward (that is to say, located relatively closer to the outside by comparing the both light modulating unit layers) is in the light transmissive state with the organic EL display panel 7 bent (folded) while the light modulating unit layer 80 located inward (that is to say, located relatively closer to the inside by comparing the both light modulating unit layers) is in the light reflective state with the organic EL display panel 7 bent to perform the bottom-emitting single-sided display. This allows light to be emitted from only the support body 10 side located outward while the organic EL display panel 7 is folded inward. Therefore, when the organic EL display panel 7 is folded inward in such a manner, the bottom-emitting single-sided display enables non-display on the inward surfaces of the organic EL display panel 7 and display only on the outward surfaces. Switching between states of the light modulating unit layers 20, 80 as described above enables brighter display than display on each of the inward and outward surfaces of the organic EL display panel 7. Furthermore, this enables the double-sided display while the organic EL display panel 7 is folded inward even in a case where it is substantially the single-sided display.

On the other hand, as illustrated in FIG. 13B, when the organic EL display panel 7 is folded outward, the organic EL display panel 7 has a cross-sectional structure in which the support body 10, the light modulating unit layer 20 (first light modulating unit layer), the inorganic insulating film 41, the organic EL element 50, the light modulating unit layer 80 (second light modulating unit layer), the sealing film 60, and the cover layer 70 are layered in the stated order from the bent portion 1*a* to the outside with respect to the bent portion 1*a* in the light emitting region.

In this case, as illustrated in FIG. 13B, of the light modulating unit layers 20 and 80, the light modulating unit layer 20 located inward is in the light reflective state with the organic EL display panel 7 bent while the light modulating unit layer 80 located outward is in the light transmissive state with the organic EL display panel 7 bent to perform the top-emitting single-sided display. This allows light to be emitted from only the cover layer 70 side located outward while the organic EL display panel 7 is folded outward. Therefore, when the organic EL display panel 7 is folded outward in such a manner, the top-emitting single-sided display enables non-display on the inward surfaces of the organic EL display panel 7 and display only on the outward surfaces. Switching between states of the light modulating unit layers 20, 80 as described above enables brighter display than display on each of the inward and outward surfaces of the organic EL display panel 7. Furthermore, this case also enables the double-sided display while the organic EL display panel 7 is folded outward even in the case where it is substantially the single-sided display.

In a typical top-emitting display device or a typical bottom-emitting display device without the light modulating unit layers 20, 80, light can be emitted from only one side when a foldable display is formed, so that the organic EL display panel 7 can only be used while being folded to one side, inward or outward. Even while the organic EL display panel 7 is not folded, light can be emitted from only one side. Furthermore, as described above, the double-emitting display device cannot use the optical interference effect, so that luminous efficiency and color reproducibility are low.

However, the present embodiment enables not only switching between the single-sided display and the double-sided display but also enables the double-sided display while the organic EL display panel 7 is folded inward or outward even in the case where it is substantially the single-sided display, as described above. The organic EL display device 1 capable of performing brighter display with higher luminous efficiency and higher color reproducibility than the double-sided display with the organic EL display panel 7 folded or unfolded 180° can be provided by performing the single-sided display with the organic EL display panel 7 folded or unfolded 180°.

Note that the state where the organic EL display panel 7 is unfolded 180° herein represents a flat state by opening the organic EL display panel 7, namely, a full-flat state.

Supplement

A display device (such as organic EL display device 1) according to an aspect 1 of the disclosure is a display device that includes a plurality of pixels (pixels 2) each including a light emitting element (such as organic EL element 50) including at least a light emitting layer (such as organic EL layer 52) between a lower electrode (lower electrode 51) and an upper electrode (upper electrode 53) and a drive element (TFT 42) electrically connected to the light emitting element. The display device includes a first light modulating unit layer (light modulating unit layer 20) including a first light modulating layer (light modulating mirror layer 23 in light modulating unit layer 20) configured to electrically switch between a light transmissive state and a light reflective state. The first light modulating unit layer, a drive element layer (TFT layer 40) including a plurality of the drive elements, and a plurality of the light emitting elements are layered in the stated order. A top-emitting single-sided display emitting light emitted from the light emitting layer from the upper electrode side and a double-sided display emitting light emitted from the light emitting layer from each of the upper electrode side and the lower electrode side are electrically switched between.

In a display device according to an aspect 2 of the disclosure in the aspect 1, the first light modulating unit layer and the lower electrode may be layered to be adjacent to each other with an inorganic insulating film (inorganic insulating film 41) between the first light modulating unit layer and the lower electrode in a light emitting region (opening BKA of bank BK) of the light emitting element in a plan view. Each of the lower electrode and the upper electrode may be a semitransparent electrode. A distance between the first light modulating layer and the upper electrode may be an optical path length (optical path lengths 4RT, 4GT, 4BT), a peak wavelength of light in color radiated from each of the pixels resonating in the optical path length.

In a display device according to an aspect 3 of the disclosure in the aspect 1 or 2, a second light modulating unit layer (light modulating unit layer 80) may be further provided on the plurality of light emitting elements, the second light modulating unit layer including a second light modulating layer (light modulating mirror layer 23 in light modulating unit layer 80) configured to electrically switch between a light transmissive state and a light reflective state independently of the first light modulating unit layer. A bottom-emitting single-sided display emitting light emitted from the light emitting layer from the lower electrode side, the top-emitting single-sided display, and the double-sided display may be electrically switched between.

In a display device according to an aspect 4 of the disclosure in the aspect 3, the second light modulating unit layer and the upper electrode may be layered to be adjacent to each other with an inorganic insulating film (such as first inorganic layer 61) between the second light modulating unit layer and the upper electrode. A distance between the second light modulating layer and the lower electrode may be an optical path length (optical path lengths 4RB, 4GB, 4BB), a peak wavelength of light in color radiated from each of the pixels resonating in the optical path length.

In a display device according to an aspect 5 of the disclosure in the aspect 4, a sealing film is provided that covers the plurality of light emitting elements. The sealing film may include a first inorganic sealing layer (first inorganic layer 61), an organic sealing layer (organic layer 62), and a second inorganic sealing layer (second inorganic layer 63) layered in the stated order from the light emitting element side. The inorganic insulating film provided between the second light modulating unit layer and the upper electrode may be the first inorganic sealing layer.

In a display device according to an aspect 6 of the disclosure in the aspect 3, the upper electrode may function as one of electrodes (light transmissive electrode) of the second light modulating unit layer. A distance between the second light modulating layer and the lower electrode may be an optical path length (optical path lengths 4RB, 4GB, 4BB), a peak wavelength of light in color radiated from each of the pixels resonating in the optical path length.

In a display device according to an aspect 7 of the disclosure in any one of the aspects 3 to 6, the display device may be a folding display device. The display device may include a first switch unit (switch unit 4) configured to switch between the light transmissive state and the light reflective state of the first light modulating unit layer and may include a second switch unit (switch unit 5) configured to switch between the light transmissive state and the light reflective state of the second light modulating unit layer. The first switch unit and the second switch unit may cause, of the first light modulating unit layer and the second light modulating unit layer, a light modulating unit layer located inward to be in the light reflective state and a light modulating unit layer located outward to be in the light transmissive state such that light emitted from the light emitting layer is not radiated from inward surfaces facing each other and is radiated from outward surfaces located opposite to the inward surfaces with the display device folded.

In a display device according to an aspect 8 of the disclosure in the aspect 7, the first light modulating unit layer may be provided on a support body (support body 10). A cover layer (cover layer 70) may be provided on the second light modulating unit layer. The first switch unit and the second switch unit may cause the first light modulating unit layer to be in the light reflective state and the second light modulating unit layer to be in the light transmissive state while the display device is folded such that the support body faces inward and the cover layer faces outward. The first switch unit and the second switch unit may cause the second light modulating unit layer to be in the light reflective state and the first light modulating unit layer to be in the light transmissive state while the display device is folded such that the cover layer faces inward and the support body faces outward.

In a display device according to an aspect 9 of the disclosure in the aspect 7 or 8, the display device may include a sensor (open/close sensors 91) configured to detect folding of the display device on both front and back surfaces of the display device. Each of the first switch unit and the second switch unit may switch between the light transmissive state and the light reflective state of the corresponding light modulating unit layer based on a detection result of the sensor.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Organic EL display device (display device)
2, 2R, 2G, 2B Pixel
4 Switch unit (first switch unit)
5 Switch unit (second switch unit)
4RT, 4GT, 4BT, 4RB, 4GB, 4BB Optical path length
7 Organic EL display panel
10 Support body
20, 80 Light modulating unit layer
21 Light transmissive electrode layer (electrode)
22 Intermediate layer
23 Light modulating mirror layer (electrode, light modulating layer)
31, 33 Inorganic insulating layer
40 TFT layer (drive element layer)
41 Inorganic insulating film
42 TFT (drive element)
50 Organic EL element (light emitting element)
51 Lower electrode
52 Organic EL layer
53 Upper electrode
60 Sealing film
61 First inorganic layer (inorganic insulating film)
62 Organic layer
63 Second inorganic layer
70 Cover layer
91 Open/close sensor (sensor)

The invention claimed is:

1. A display device comprising:
a plurality of pixels each including:
   a light emitting element including at least a light emitting layer between a lower electrode and an upper electrode, and
   a drive element electrically connected to the light emitting element; and
a first light modulating unit layer including a first light modulating layer configured to electrically switch between a light transmissive state and a light reflective state, wherein
the first light modulating unit layer, a drive element layer including a plurality of the drive elements, and a plurality of the light emitting elements are layered in the stated order,
a top-emitting single-sided display emitting light emitted from the light emitting layer from an upper electrode side and a double-sided display extracting light emitted from the light emitting layer from each of the upper electrode side and a lower electrode side are electrically switched between,
a second light modulating unit layer is further provided on the plurality of light emitting elements, the second light modulating unit layer including a second light modulating layer configured to electrically switch between a light transmissive state and a light reflective state independently of the first light modulating unit layer,
a bottom-emitting single-sided display extracting light emitted from the light emitting layer from the lower electrode side, the top-emitting single-sided display, and the double-sided display are electrically switched between,
the second light modulating unit layer and the upper electrode are layered to be adjacent to each other with an inorganic insulating film between the second light modulating unit layer and the upper electrode,
a distance between the second light modulating layer and the lower electrode is an optical path length, a peak wavelength of light in color radiated from each of the plurality of pixels resonating in the optical path length,
a sealing film is provided that covers the plurality of light emitting elements,
the sealing film includes a first inorganic sealing layer, an organic sealing layer, and a second inorganic sealing layer layered in the stated order from a light emitting element side, and
the inorganic insulating film provided between the second light modulating unit layer and the upper electrode includes the first inorganic sealing layer.

2. The display device according to claim 1, wherein
the display device includes a folding display device,
the display device includes:
   a first switch unit configured to switch between the light transmissive state and the light reflective state of the first light modulating unit layer, and
   a second switch unit configured to switch between the light transmissive state and the light reflective state of the second light modulating unit layer, and
in the first light modulating unit layer and the second light modulating unit layer when the folding display device is folded, the first switch unit and the second switch unit cause a light modulating unit layer located nearest inward of folded surfaces of the folded folding display device to be in the light reflective state and a light modulating unit layer located nearest outward of the folded surfaces of the folded folding display device to be in the light transmissive state such that light emitted from the light emitting layer is not radiated from inward surfaces facing each other and is radiated from outward surfaces located opposite to the inward surfaces with the display device folded.

3. The display device according to claim 2,
wherein the first light modulating unit layer is provided on a support body,
a cover layer is provided on the second light modulating unit layer, and
the first switch unit and the second switch unit cause
the first light modulating unit layer to be in the light reflective state and the second light modulating unit layer to be in the light transmissive state while the display device is folded such that the support body faces inward and the cover layer faces outward, and
the second light modulating unit layer to be in the light reflective state and the first light modulating unit layer to be in the light transmissive state while the display device is folded such that the cover layer faces inward and the support body faces outward.

4. The display device according to claim 2,
wherein the display device includes a sensor configured to detect folding of the display device on both front and back surfaces of the display device, and each of the first switch unit and the second switch unit switches between the light transmissive state and the light reflective state of the corresponding light modulating unit layer based on a detection result of the sensor.

5. A display device, comprising:
a plurality of pixels each including
a light emitting element including at least a light emitting layer between a lower electrode and an upper electrode, and
a drive element electrically connected to the light emitting element; and
a first light modulating unit layer including a first light modulating layer configured to electrically switch between a light transmissive state and a light reflective state,
wherein the first light modulating unit layer, a drive element layer including a plurality of the drive elements, and a plurality of the light emitting elements are layered in the stated order,
a top-emitting single-sided display emitting light emitted from the light emitting layer from an upper electrode side and a double-sided display emitting light emitted from the light emitting layer from each of the upper electrode side and a lower electrode side are electrically switched between,
the first light modulating unit layer and the lower electrode are layered to be adjacent to each other with an inorganic insulating film between the first light modulating unit layer and the lower electrode in a light emitting region of the light emitting element in a plan view,
each of the lower electrode and the upper electrode includes a semitransparent electrode, and a distance between the first light modulating layer and the upper electrode is a first optical path length, a peak wavelength of light in color radiated from each of the plurality of pixels resonating in the first optical path length,
a second light modulating unit layer is further provided on the plurality of light emitting elements, the second light modulating unit layer including a second light modulating layer configured to electrically switch between a light transmissive state and a light reflective state independently of the first light modulating unit layer,
a bottom-emitting single-sided display emitting light emitted from the light emitting layer from the lower electrode side, the top-emitting single-sided display, and the double-sided display are electrically switched between,
the second light modulating unit layer and the upper electrode are layered to be adjacent to each other with an inorganic insulating film between the second light modulating unit layer and the upper electrode,
a distance between the second light modulating layer and the lower electrode is a second optical path length, a peak wavelength of light in color radiated from each of the pixels resonating in the second optical path length,
a sealing film is provided that covers the plurality of light emitting elements,
the sealing film includes a first inorganic sealing layer, an organic sealing layer, and a second inorganic sealing layer layered in the stated order from a light emitting element side, and
the inorganic insulating film provided between the second light modulating unit layer and the upper electrode includes the first inorganic sealing layer.

6. The display device according to claim 5, wherein the display device includes a folding display device,
the display device includes:
a first switch unit configured to switch between the light transmissive state and the light reflective state of the first light modulating unit layer, and
a second switch unit configured to switch between the light transmissive state and the light reflective state of the second light modulating unit layer, and
in the first light modulating unit layer and the second light modulating unit layer when the folding display device is folded, the first switch unit and the second switch unit cause a light modulating unit layer located nearest inward of folded surfaces of the folded folding display device to be in the light reflective state and a light modulating unit layer located nearest outward of the folded surfaces of the folded folding display device to be in the light transmissive state such that light emitted from the light emitting layer is not radiated from inward surfaces facing each other and is radiated from outward surfaces located opposite to the inward surfaces with the display device folded.

7. The display device according to claim 6,
wherein the first light modulating unit layer is provided on a support body,
a cover layer is provided on the second light modulating unit layer, and
the first switch unit and the second switch unit cause
the first light modulating unit layer to be in the light reflective state and the second light modulating unit layer to be in the light transmissive state while the display device is folded such that the support body faces inward and the cover layer faces outward, and
the second light modulating unit layer to be in the light reflective state and the first light modulating unit layer to be in the light transmissive state while the display device is folded such that the cover layer faces inward and the support body faces outward.

8. The display device according to claim 6,
wherein the display device includes a sensor configured to detect folding of the display device on both front and back surfaces of the display device, and
each of the first switch unit and the second switch unit switches between the light transmissive state and the light reflective state of the corresponding light modulating unit layer based on a detection result of the sensor.

9. A display device, comprising:
a plurality of pixels each including:
a light emitting element including at least a light emitting layer between a lower electrode and an upper electrode and a drive element electrically connected to the light emitting element; and
a first light modulating unit layer including a first light modulating layer configured to electrically switch between a light transmissive state and a light reflective state, wherein
the first light modulating unit layer, a drive element layer including a plurality of the drive elements, and a plurality of the light emitting elements are layered in the stated order,
a top-emitting single-sided display emitting light emitted from the light emitting layer from an upper electrode side and a double-sided display emitting light emitted from the light emitting layer from each of the upper electrode side and a lower electrode side are electrically switched between, a second light modulating unit layer is further provided on the plurality of light emitting elements, the second light modulating unit layer including a second light modulating layer configured to electrically switch between a light transmissive state and a light reflective state independently of the first light modulating unit layer, a bottom-emitting single-sided display emitting light emitted from the light emitting layer from the lower electrode side, the top-emitting single-sided display, and the double-sided display are electrically switched between, the display device includes a folding display device, the display device includes:
- a first switch unit configured to switch between the light transmissive state and the light reflective state of the first light modulating unit layer, and
- a second switch unit configured to switch between the light transmissive state and the light reflective state of the second light modulating unit layer, and in the first light modulating unit layer and the second light modulating unit layer when the folding display device is folded, a light modulating unit layer located nearest inward of folded surfaces of the folded folding display device to be in the light reflective state and a light modulating unit layer located nearest outward of the folded surfaces of the folded folding display device to be in the light transmissive state such that light emitted from the light emitting layer is not radiated from inward surfaces facing each other and is radiated from outward surfaces located opposite to the inward surfaces with the display device folded.

10. The display device according to claim 9,
wherein the first light modulating unit layer is provided on a support body,
a cover layer is provided on the second light modulating unit layer, and
the first switch unit and the second switch unit cause
the first light modulating unit layer to be in the light reflective state and the second light modulating unit layer to be in the light transmissive state while the display device is folded such that the support body faces inward and the cover layer faces outward, and
the second light modulating unit layer to be in the light reflective state and the first light modulating unit layer to be in the light transmissive state while the display device is folded such that the cover layer faces inward and the support body faces outward.

11. The display device according to claim 9,
wherein the display device includes a sensor configured to detect folding of the display device on both front and back surfaces of the display device, and
each of the first switch unit and the second switch unit switches between the light transmissive state and the light reflective state of the corresponding light modulating unit layer based on a detection result of the sensor.

12. The display device according to claim 9, wherein
the first light modulating unit layer and the lower electrode are layered to be adjacent to each other with an inorganic insulating film between the first light modulating unit layer and the lower electrode in a light emitting region of the light emitting element in a plan view, and
each of the lower electrode and the upper electrode includes a semitransparent electrode, and a distance between the first light modulating layer and the upper electrode is an optical path length, a peak wavelength of light in color radiated from each of the plurality of pixels resonating in the optical path length.

13. The display device according to claim 9, wherein
the second light modulating unit layer and the upper electrode are layered to be adjacent to each other with an inorganic insulating film between the second light modulating unit layer and the upper electrode, and
a distance between the second light modulating layer and the lower electrode is an optical path length, a peak wavelength of light in color radiated from each of the plurality of pixels resonating in the optical path length.

14. The display device according to claim 9, wherein
the upper electrode functions as one of electrodes of the second light modulating unit layer, and
a distance between the second light modulating layer and the lower electrode is an optical path length, a peak wavelength of light in color radiated from each of the plurality of pixels resonating in the optical path length.

* * * * *